United States Patent
Kim

(10) Patent No.: US 11,017,836 B2
(45) Date of Patent: May 25, 2021

(54) APPARATUS AND METHOD FOR NON-VOLATILE MEMORY FOR APPLYING VOLTAGES TO SELECTED AND UNSELECTED STRINGS DURING THE CHANNEL INITIALIZATION FOR IMPROVED READ OPERATION

(71) Applicant: SK hynix Inc., Gyeonggi-do (KR)

(72) Inventor: Jong Wook Kim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/787,726

(22) Filed: Feb. 11, 2020

(65) Prior Publication Data

US 2021/0035622 A1 Feb. 4, 2021

(30) Foreign Application Priority Data

Aug. 1, 2019 (KR) .......................... 10-2019-0094046

(51) Int. Cl.
*G11C 16/26* (2006.01)
*G11C 11/4074* (2006.01)
(Continued)

(52) U.S. Cl.
CPC ...... *G11C 11/4074* (2013.01); *G11C 11/4076* (2013.01); *G11C 11/4085* (2013.01); *G11C 11/4094* (2013.01); *G11C 16/0483* (2013.01); *G11C 16/20* (2013.01); *G11C 16/26* (2013.01); *G11C 16/30* (2013.01); *G11C 16/32* (2013.01);
(Continued)

(58) Field of Classification Search
CPC ............ G11C 16/0483; G11C 16/3418; G11C 16/3427; G11C 16/30; G11C 16/32; G11C 16/26; G11C 16/20
See application file for complete search history.

(56) References Cited

U.S. PATENT DOCUMENTS

2014/0241069 A1* 8/2014 Kwak .................... G11C 16/24
365/185.22
2016/0027520 A1* 1/2016 Choi ................... G11C 16/3427
365/185.17
(Continued)

FOREIGN PATENT DOCUMENTS

KR 10-2013-0087857 8/2013
KR 10-2016-0071946 6/2016

*Primary Examiner* — Mushfique Siddique
(74) *Attorney, Agent, or Firm* — IP & T Group LLP

(57) ABSTRACT

A memory device and an operating method thereof are provided. A memory device includes a memory cell array including a plurality of strings, a voltage generating circuit configured to apply a turn-on voltage to the plurality of strings during a predetermined time period during a channel initialization operation of a read operation of a selected string among the plurality of strings, and control logic configured to set the predetermined time period of applying the turn-on voltage to the plurality of strings and to control the voltage generating circuit to apply the turn-on voltage to the plurality of strings during the predetermined time period, wherein the control logic sets the predetermined time period corresponding to the selected string as a first time period and the predetermined time period corresponding to unselected strings among the plurality of strings to be shorter than the first time period.

22 Claims, 19 Drawing Sheets

(51) Int. Cl.
*G11C 11/4076* (2006.01)
*G11C 11/4094* (2006.01)
*G11C 11/408* (2006.01)
*G11C 16/04* (2006.01)
*G11C 16/34* (2006.01)
*G11C 16/32* (2006.01)
*G11C 16/30* (2006.01)
*G11C 16/20* (2006.01)

(52) U.S. Cl.
CPC ...... *G11C 16/3418* (2013.01); *G11C 16/3427* (2013.01)

(56) References Cited

U.S. PATENT DOCUMENTS

| | | | |
|---|---|---|---|
| 2016/0035431 A1* | 2/2016 | Nam | G11C 16/10 365/185.25 |
| 2018/0053552 A1* | 2/2018 | Tanzawa | G11C 16/10 |
| 2018/0137925 A1* | 5/2018 | Nam | G11C 16/10 |
| 2018/0190354 A1* | 7/2018 | Lee | G11C 16/0483 |
| 2020/0020406 A1* | 1/2020 | Kim | G11C 11/5642 |
| 2020/0133572 A1* | 4/2020 | Park | G06F 3/0659 |
| 2020/0143883 A1* | 5/2020 | Joo | G11C 16/08 |

* cited by examiner

APPARATUS AND METHOD FOR NON-VOLATILE MEMORY FOR APPLYING VOLTAGES TO SELECTED AND UNSELECTED STRINGS DURING THE CHANNEL INITIALIZATION FOR IMPROVED READ OPERATION

CROSS-REFERENCE TO RELATED APPLICATION

The present application claims priority under 35 U.S.C. § 119(a) to Korean patent application number 10-2019-0094046, filed on Aug. 1, 2019, which is incorporated herein by reference in its entirety.

BACKGROUND

Field of Invention

Various embodiments of the present disclosure generally relate to an electronic device, and more particularly, to a memory device and a method of operating the same.

Description of Related Art

Recently, a paradigm with respect to a computing environment has changed to ubiquitous computing which is capable of using a computer system virtually anytime and anywhere. Accordingly, use of portable electronic devices, such as a mobile phone, a digital camera, and a laptop, has been rapidly increasing. The portable electronic devices as described above may generally utilize memory systems employing memory devices, that is, data storage devices. A data storage device may be used as a main memory device or an auxiliary memory device of a portable electronic device.

A data storage device employing a memory device does not include a mechanical driver, and thus may have excellent stability and durability with an extremely high information access speed and low power consumption. Examples of a memory system having the above-stated characteristics, are a data storage device including a Universal Serial Bus (USB) memory device, a memory card having various interfaces, a Solid-State Drive (SSD), and the like.

Memory devices are generally classified into volatile memory devices and nonvolatile memory devices.

A nonvolatile memory device may have comparatively low write and read speeds, but may retain stored data in the absence of supplied power. Therefore, a nonvolatile memory device may be used when there is a need for storing data which should be retained regardless of a supply of power. Examples of nonvolatile memory devices include Read Only Memory (ROM), Mask ROM (MROM), Programmable ROM (PROM), Erasable Programmable ROM (EPROM), Electrically Erasable Programmable ROM (EEPROM), flash memory, Phase change Random Access Memory (PRAM), Magnetic RAM (MRAM), Resistive RAM (RRAM), and Ferroelectric RAM (FRAM). Flash memory may be classified into NOR-type memory and NAND-type memory.

SUMMARY

A nonvolatile memory device may perform a channel initialization operation to remove hot holes remaining in channels during a read operation. During the channel initialization operation, the nonvolatile memory device may turn on source select transistors and drain select transistors of channels included in a selected memory block to remove the hot holes remaining in the channels through a source line, and thus reliability of the read operation may be improved.

Various embodiments of the present disclosure provide a memory device exhibiting improved electrical characteristics during a read operation, and a method of operating the memory device.

According to an embodiment, a memory device may include a memory cell array including a plurality of strings, a voltage generating circuit configured to apply a turn-on voltage to the plurality of strings during a predetermined time period during a channel initialization operation of a read operation of a selected string among the plurality of strings, and control logic configured to set the predetermined time period of applying the turn-on voltage to the plurality of strings and to control the voltage generating circuit to apply the turn-on voltage to the plurality of strings during the predetermined time period, wherein the control logic sets the predetermined time period corresponding to the selected string as a first time period and the predetermined time period corresponding to unselected strings among the plurality of strings to be shorter than the first time period.

According to an embodiment, a memory device may include a memory cell array including a plurality of strings, a voltage generating circuit configured to apply a turn-on voltage to the plurality of strings during a predetermined time period during a channel initialization operation of a read operation of a selected string among the plurality of strings, and control logic configured to set the predetermined time period of applying the turn-on voltage to the plurality of strings and to control the voltage generating circuit to apply the turn-on voltage to the plurality of strings during the predetermined time period, wherein the control logic sets the predetermined time period of a first unselected string sharing a source select line with the selected string among the plurality of strings as a first time period and sets the predetermined time period of a remaining second unselected string among the plurality of strings as a second time period shorter than the first time period.

According to an embodiment, a memory device may include a memory cell array including a plurality of strings, a voltage generating circuit configured to apply a turn-on voltage to the plurality of strings during a predetermined time period during a channel initialization operation of a read operation of a selected string among the plurality of strings, and control logic configured to set the predetermined time period of applying the turn-on voltage to the plurality of strings and to control the voltage generating circuit to apply the turn-on voltage to the plurality of strings during the predetermined time period, wherein the control logic sets the predetermined time period such that the turn-on voltage is applied to a source select transistor of unselected strings among the plurality of strings during a first time period and the turn-on voltage is applied to a drain select transistor of the unselected strings during a time period longer than the first time period.

According to an embodiment, a method of operating a memory device may include providing a memory cell array including a plurality of strings, setting a time period, for which a turn-on voltage to the plurality of strings during a channel initialization operation such that the time period for a selected string and the time period for unselected strings are different from each other, and applying the turn-on voltage to the selected string and the unselected strings during the channel initialization operation.

DETAILED DESCRIPTION

Figure 1:
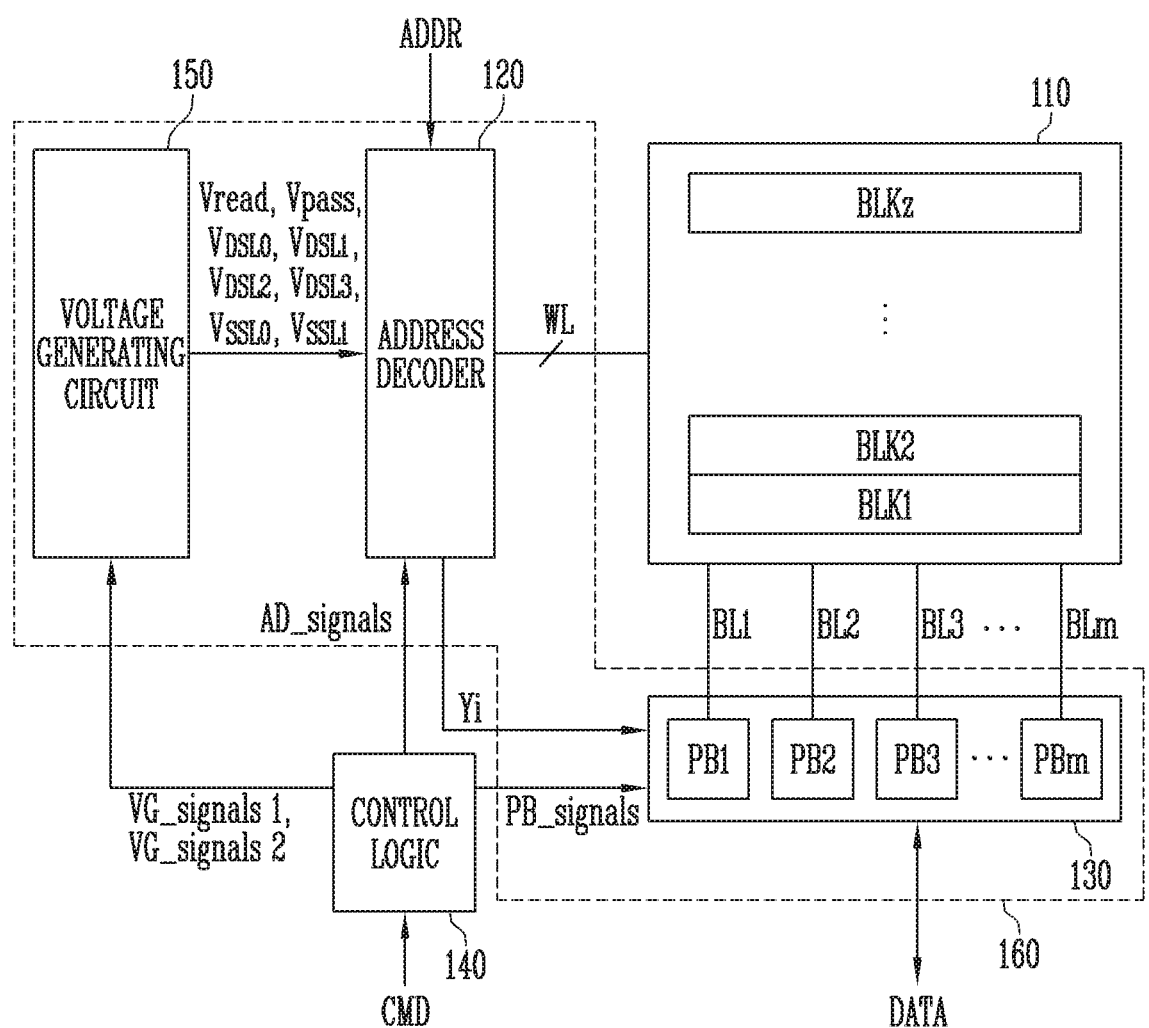
FIG. 1 is a block diagram illustrating a memory device according to an embodiment of the present disclosure.

Hereinafter, specific embodiments in accordance with the concepts which are disclosed in this specification are provided. It is noted, however, that the disclosed concepts may be carried out by various other embodiments or variations thereof, and that the disclosed concepts are not limited to the specific embodiments described in this specification.

Moreover, various modifications and changes may be applied to the described embodiments in accordance with the disclosed concepts. It is further noted that the described embodiments may be illustrated in simplified drawings. However, the embodiments according to the concepts of the present disclosure are not construed as limited to the specified disclosures, and may include all changes, equivalents, or substitutes that do not depart from the spirit and technical scope of the present disclosure.

While terms such as "first" and "second" may be used to describe various components, such components should not be understood as being limited to the above terms. The above terminologies are used to distinguish one component from the other component, for example, a first component may be referred to as a second component without departing from the scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include plural forms as well, unless the context clearly indicates otherwise. In the present specification, it should be understood that terms "include" or "have" indicate that a feature, a number, a step, an operation, a component, a part or a combination of those described in the specification is present, but do not exclude a possibility of the presence or addition of one or more other features, numbers, steps, operations, components, parts or combinations thereof, in advance.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies will not be described in detail to avoid obfuscating the disclosure with well-known details. This intends to disclose the gist of the present disclosure more clearly by omitting unnecessary description.

Hereinafter, embodiments of the present disclosure will be described in detail with reference to the accompanying drawings in order for those skilled in the art to be able to readily implement the technical spirit of the present disclosure.

FIG. 1 is a block diagram illustrating a memory device 100 according to an embodiment of the present disclosure.

Referring to FIG. 1, the memory device 100 may include a memory cell array 110, an address decoder 120, a read and write circuit 130, a control logic 140, and a voltage generating circuit 150. The address decoder 120, the read and write circuit 130, and the voltage generating circuit 150 may be defined as a peripheral circuit 160 configured to perform an operation on the memory cell array 110 such a read or write operation.

The memory cell array 110 may include a plurality of memory blocks BLK1 to BLKz. The plurality of memory blocks BLK1 to BLKz may be coupled to the address decoder 120 through word lines WLs. The plurality of memory blocks BLK1 to BLKz may be coupled to the read and write circuit 130 through bit lines BL1 to BLm. Each of the plurality of memory blocks BLK1 to BLKz may include a plurality of memory cells. In an embodiment, the plurality of memory cells may be nonvolatile memory cells. Memory cells coupled to the same word line among the plurality of memory cells may be defined as one page. In other words, the memory cell array 110 may include a plurality of pages.

Each of the plurality of memory blocks BLK1 to BLKz of the memory cell array 110 may include a plurality of strings. Each of the plurality of strings may include a drain select transistor, a plurality of memory cells, and a source select transistor coupled in series between a bit line and a source line. In addition, each of the plurality of strings may include a pass transistor between a source select transistor and memory cells and a pass transistor between a drain select transistor and memory cells, and may further include a pipe gate transistor between memory cells. The memory cell array 110 will be described in detail below.

The address decoder 120 may be coupled to the memory cell array 110 through the word lines WLs. The address decoder 120 may be configured to operate in response to address decoder control signals AD_signals generated in the control logic 140. The address decoder 120 may receive an address ADDR through an input/output buffer (not illustrated) in the memory device 100.

The address decoder 120 may decode a row address among the received address ADDR and apply a plurality of operating voltages including a read voltage Vread, a pass voltage Vpass, a plurality of drain select line voltages $V_{DSL0}$, $V_{DSL1}$, $V_{DSL2}$, and $V_{DSL3}$, and a plurality of source select line voltages $V_{SSL0}$ and $V_{SSL1}$ generated in the voltage generating circuit 150 to the plurality of memory cells, the drain select transistors, the source select transistors and the pass transistors of the memory cell array 110 according to the decoded row address during the read operation.

The address decoder 120 may be configured to decode a column address among the received address ADDR during the read operation. The address decoder 120 may transfer the decoded column address Yi to the read and write circuit 130.

The address ADDR received during the read operation may include a block address, a row address, and a column address. The address decoder 120 may select one memory block and one word line according to a block address and a row address. A column address may be decoded by the address decoder 120 and provided to the read and write circuit 130.

The address decoder 120 may include a block decoder, a row decoder, a column decoder, an address buffer, and the like.

The read and write circuit 130 may include a plurality of page buffers PB1 to PBm. The plurality of page buffers PB1 to PBm may be coupled to the memory cell array 110 through the bit lines BL1 to BLm. Each of the plurality of page buffers PB1 to PBm may perform a read operation by precharging the bit lines BL1 to BLm to a set level during a precharge operation of the read operation and by sensing a potential level or an amount of current of the bit lines BL1 to BLm during a read voltage applying operation.

The read and write circuit 130 may operate in response to page buffer control signals PB_signals received from the control logic 140.

According to an embodiment, the read and write circuit 130 may include page buffers (or page registers) and a column select circuit.

The control logic 140 may be coupled to the address decoder 120, the read and write circuit 130, and the voltage generating circuit 150. The control logic 140 may receive a command CMD through the input/output buffer (not illustrated) of the memory device 100. The control logic 140 may be configured to control the general operations of the memory device 100 in response to the command CMD. For example, the control logic 140 may receive the command CMD corresponding to the read operation and generate and output the address decoder control signals AD_signals to control the address decoder 120, the page buffer control signals PB_signals to control the read and write circuit 130, and voltage generating circuit control signals VG_signals 1 and VG_signals 2 to control the voltage generating circuit 150 in response to the received command CMD.

The control logic 140 according to an embodiment of the present disclosure may adjust a time period, for which a turn-on voltage is applied to a source select transistor and a drain select transistor of a selected string, to be longer than a time period, for which a turn-on voltage is applied to a source select transistor and a drain select transistor of an unselected string, during a channel initialization operation of a read operation. Accordingly, the turn-on voltage may be applied to the drain select transistor and the source select transistor of the selected string for a sufficient time to effectively remove a hot carrier remaining in a channel, and the turn-on voltage may be applied to the drain select transistor and the source select transistor of the unselected string for a short time to prevent or mitigate deterioration of a boosting phenomenon during a read voltage applying operation subsequent to the channel initialization operation, therefore, a read disturb phenomenon may be prevented or lessened.

In addition, the control logic 140 may adjust a time period, for which a turn-on voltage is applied to a drain select transistor of an unselected string sharing a source line with a selected string, to be longer than a time period, for which a turn-on voltage is applied to a source select transistor and a drain select transistor of remaining unselected strings. A hot carrier is relatively less generated in the selected string. Therefore, a time period, for which a turn-on voltage is applied to the unselected string sharing the source line with the selected string, may be adjusted to be longer than a time period, for which a turn-on voltage is applied to the remaining unselected strings to further mitigate the read disturb phenomenon.

Moreover, the control logic 140 may adjust a time period, for which a turn-on voltage is applied to a drain select line of unselected strings, to be longer than a time period, for which a turn-on voltage is applied to a source select line of the unselected strings. Accordingly, when a size of a source select transistor and a size of a drain select transistor are different, a time period, for which a turn-on voltage is applied to the source select transistor, and a time period, for which a turn-on voltage is applied to the drain select transistor, may be adjusted to be different from each other.

The voltage generating circuit 150 may generate and output the read voltage Vread, the pass voltage Vpass, the plurality of drain select line voltages $V_{DSL0}$, $V_{DSL1}$, $V_{DSL2}$, and $V_{DSL3}$, and the plurality of source select line voltages VSSL0 and VSSL1 to the address decoder 120 in response to the voltage generating circuit control signals VG_signals 1 and VG_signals 2 output from the control logic 140 during the read operation. The plurality of drain select line voltages VDSL0, VDSL1, VDSL2, and VDSL3 and the plurality of source select line voltages VSSL0 and VSSL1 may be a turn-on voltage applied during a channel initialization operation.

Figure 2:
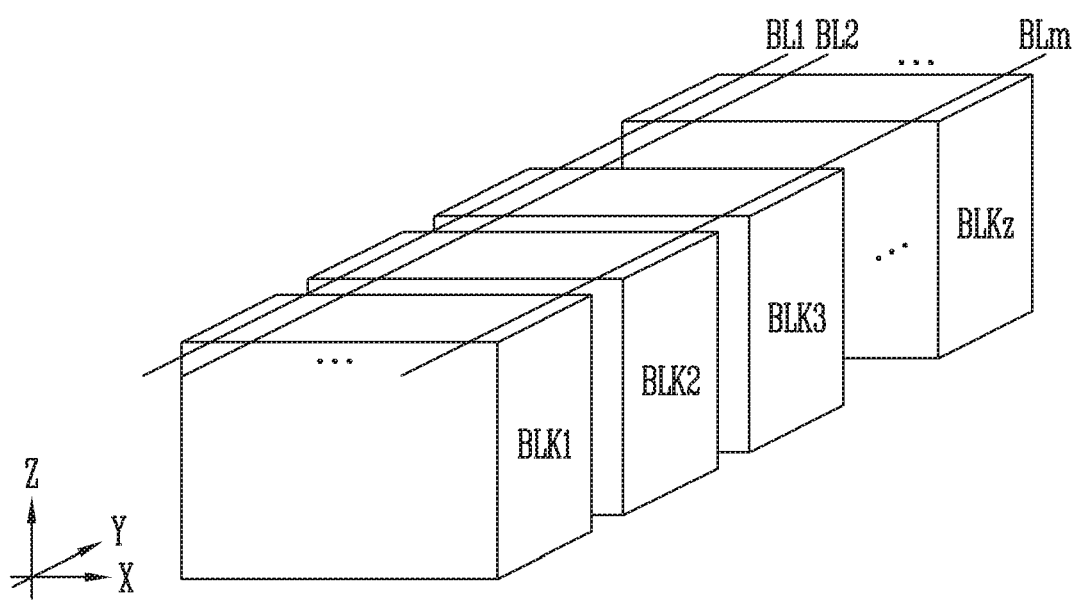
FIG. 2 is a diagram illustrating three-dimensionally structured memory blocks.

FIG. 2 is a diagram illustrating three-dimensionally structured memory blocks.

Referring to FIG. 2, the three-dimensionally structured memory blocks BLK1 to BLKz may be arranged to be spaced apart from each other in a direction Y in which the bit lines BL1 to BLm extend. For example, the first to z memory blocks BLK1 to BLKz may be arranged to be spaced apart from each other in a second direction Y and may include a plurality of memory cells stacked in a third direction Z. The configuration of one of the first to z memory blocks BLK1 to BLKz will be described in detail with reference to FIGS. 3 and 4.

Figure 3:
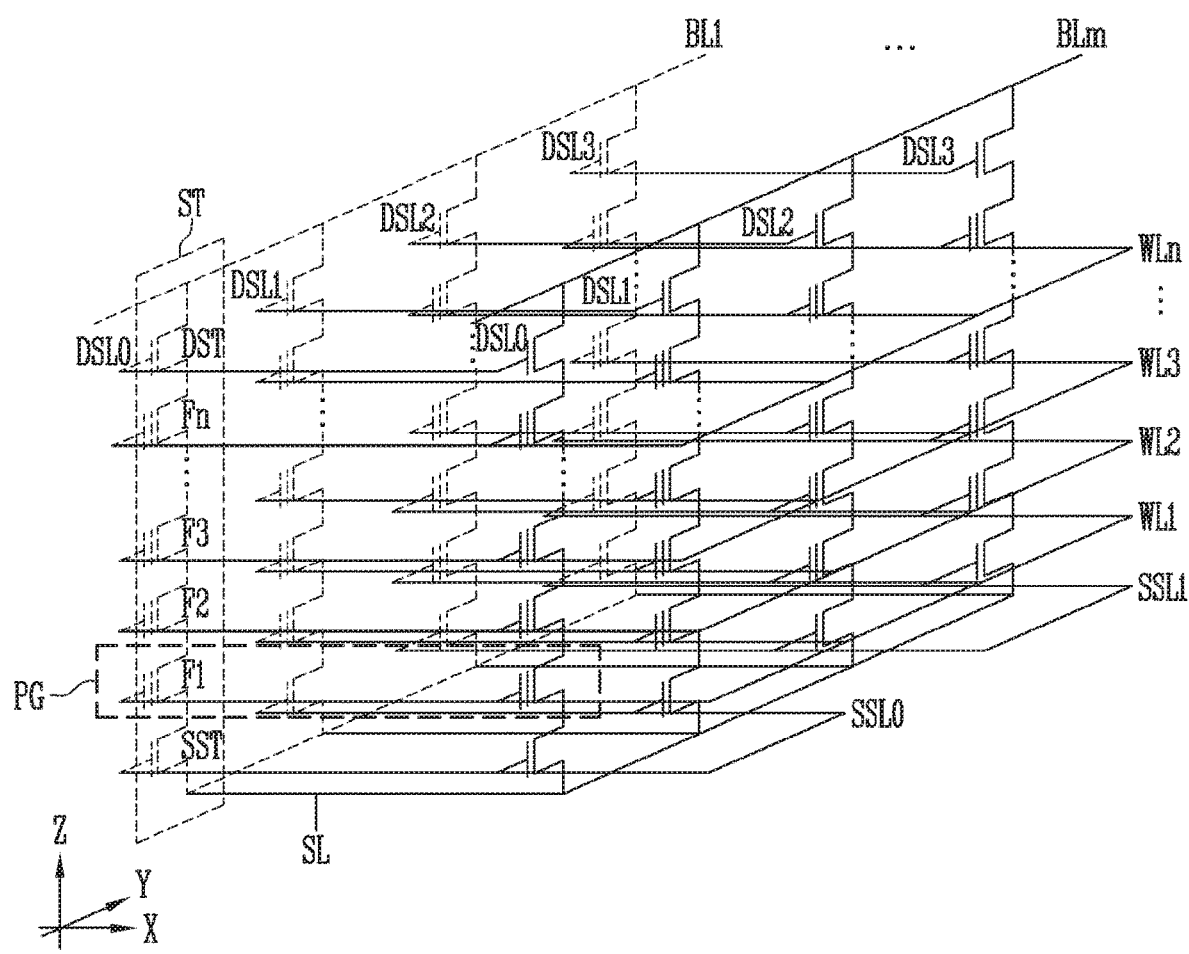
FIG. 3 is a detailed circuit diagram illustrating one of the memory blocks shown in FIG. 2.

FIG. 3 is a detailed circuit diagram illustrating one of the memory blocks shown in FIG. 2.

Figure 4:
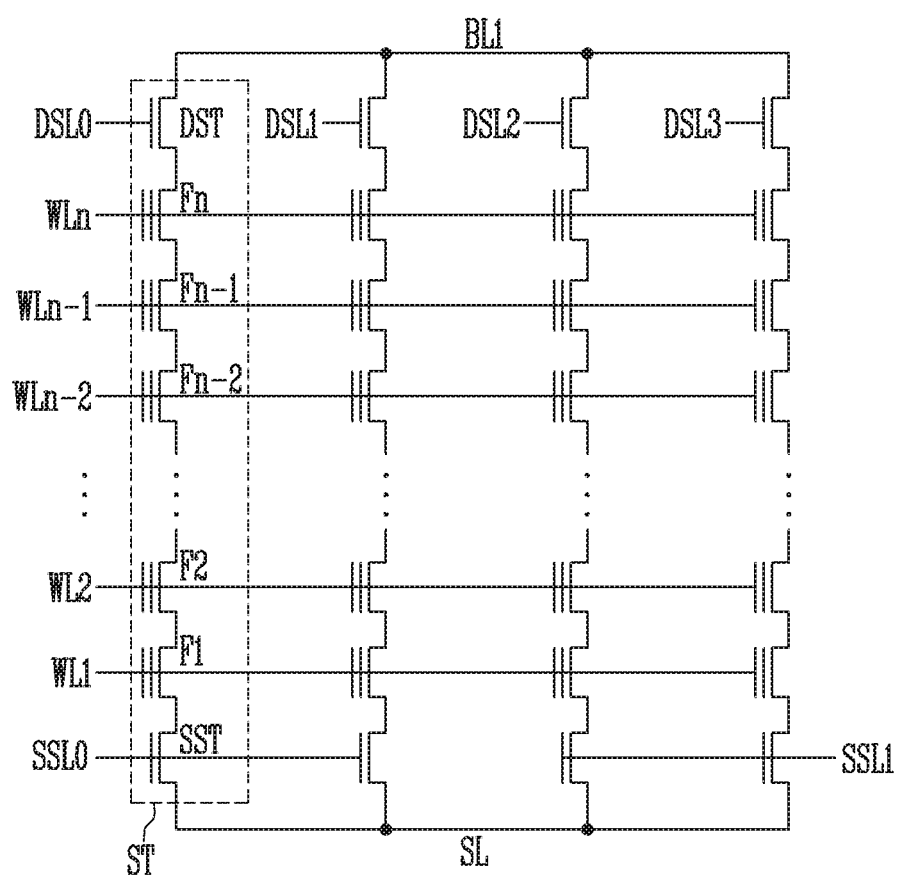
FIG. 4 is a circuit diagram illustrating strings shown in FIG. 3.

FIG. 4 is a circuit diagram illustrating strings shown in FIG. 3.

Referring to FIGS. 3 and 4, each of a plurality of strings ST may be coupled between the bit lines BL1 to BLm and a source line SL. The string ST coupled between the first bit line BL1 and the source line SL will be described below as an example.

The string ST may include a source select transistor SST, memory cells F1 to Fn, and a drain select transistor DST coupled in series between the source line SL and the first bit line BL1, where n is a positive integer. Gates of the source select transistors SST included in the different strings ST coupled to different bit lines BL1 to BLm may be coupled to a first source select line SSL0 and a second source select line SSL1. For example, source select transistors adjacent to each other in the second direction Y among the source select transistors SST may be coupled to the same source select line. For example, when the source select transistors SST are sequentially arranged in the second direction Y, gates of the source select transistors SST arranged in a first direction X from the first source select transistor SST and included in the different strings ST and gates of the source select transistors SST arranged in the first direction X from the second source select transistor SST and included in the different strings ST may be coupled to the first source select line SSL0. In addition, gates of the source select transistors SST arranged in the first direction X from the third source select transistor SST and included in the different strings ST and gates of the source select transistors SST arranged in the first direction X from the fourth source select transistor SST and included in the different strings ST may be coupled to the second source select line SSL1.

Gates of the memory cells F1 to Fn may be coupled to word lines WL1 to WLn and gates of the drain select transistors DST may be coupled to one of first, second, third, and fourth drain select lines DSL0, DSL1, DSL2, and DSL3.

Gates of transistors arranged in the first direction X among the drain select transistors DST may be coupled to the same drain select line (for example, DSL0) in common, but gates of transistors arranged in the second direction Y among the drain select transistors DST may be coupled to the different drain select lines DSL1, DSL2, and DSL3. For example, when the drain select transistors DST are sequentially arranged in the second direction Y, gates of the drain select transistors DST arranged in the first direction X from the first drain select transistor DST and included in the different strings ST may be coupled to the first drain select line DSL0. The drain select transistors DST arranged in the second direction Y from the drain select transistors DST coupled to the first drain select line DSL0 may be sequentially coupled to the second, third, and fourth drain select lines DSL1, DSL2, and DSL3. Accordingly, the strings ST coupled to a selected drain select line may be selected and the strings ST coupled to remaining unselected drain select lines might not be selected in the selected memory block.

Memory cells coupled to the same word line may constitute a page PG. The page may refer to a physical page. For example, a group of memory cells coupled to the same word line in the first direction X among the strings ST coupled to the first to mth bit lines BL1 to BLm may be referred to as the page PG. For example, memory cells arranged in the first direction X among the first memory cells F1 coupled to the first word line WL1 may constitute one page PG. Memory cells arranged in the second direction Y among the first memory cells F1 coupled to the first word line WL1 in common may define different pages. Accordingly, when the first drain select line DSL0 is a selected drain select line and the first word line WL1 is a selected word line, a page coupled to the first drain select line DSL0 among the plurality of pages PG coupled to the first word line WL1 may be a selected page. Pages coupled to the first word line WL1 in common but coupled to the unselected second, third, fourth drain select lines DSL1, DSL2, and DSL3 may be unselected pages.

In FIGS. 3 and 4, it is illustrated that one source select transistor SST and one drain select transistor DST are included in one string ST. However, a plurality of source select transistors SST and a plurality of drain select transistors DST may be included in one string ST depending on a memory device. In addition, dummy cells may be further included between the source select transistor SST, the memory cells F1 to Fn, and the drain select transistor DST depending on a memory device. Dummy cells do not store user data unlike general memory cells F1 to Fn but may be used to improve electrical characteristics of each string ST. However, dummy cells are not an important configuration in this embodiment, therefore detailed description thereof will be omitted.

Figure 5:
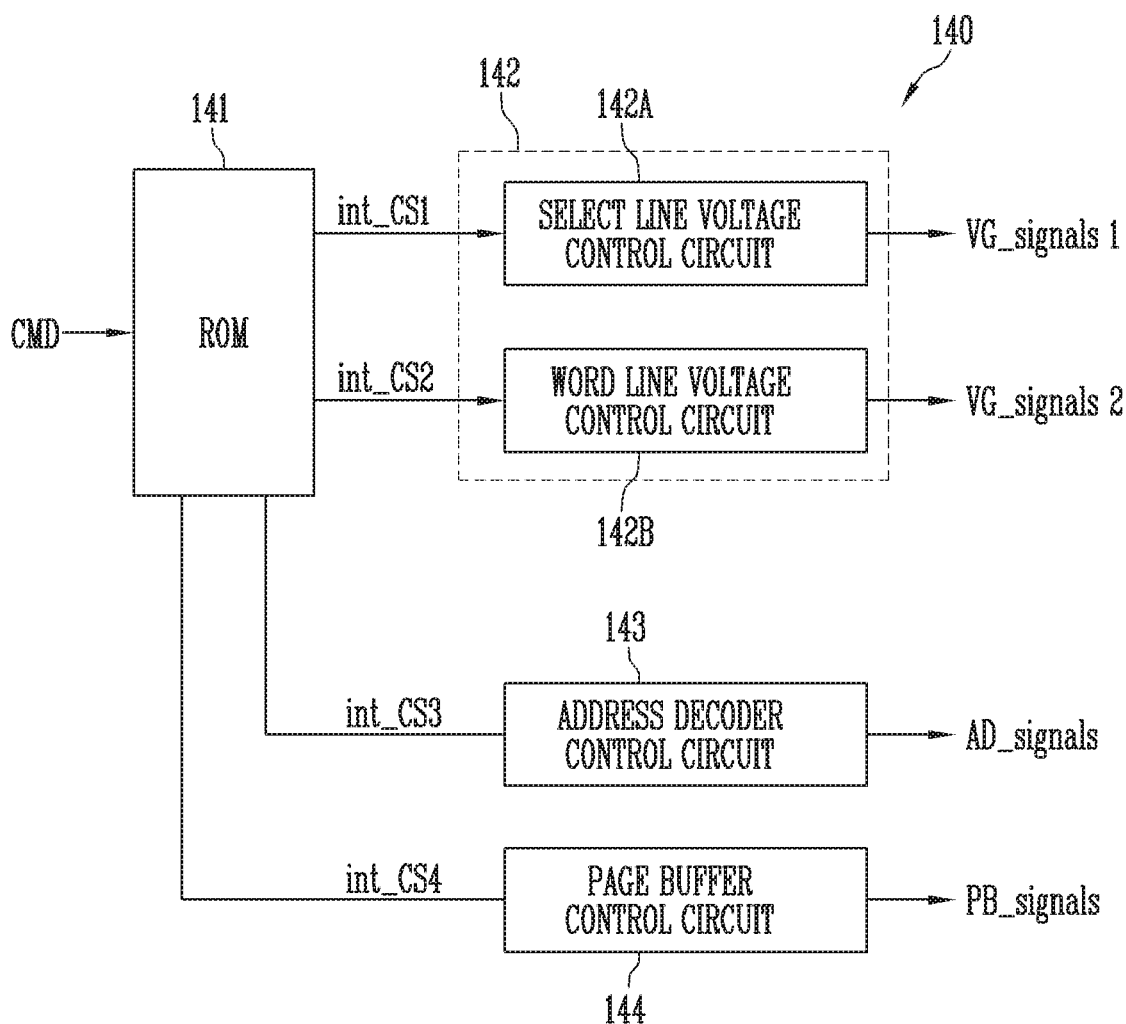
FIG. 5 is a diagram illustrating an example of a control logic shown in FIG. 1.

FIG. 5 is a diagram illustrating the control logic 140 shown in FIG. 1.

Referring to FIG. 5, the control logic 140 may include Read Only Memory (ROM) 141, a voltage generation control circuit 142, an address decoder control circuit 143, and a page buffer control circuit 144.

The ROM 141 may store an algorithm to perform general operations of the memory device and generate a plurality of internal control signals int_CS1, int_CS2, int_CS3, and int_CS4 in response to the command CMD input from an external device, for example, a host coupled to the memory device.

The voltage generation control circuit 142 may include a select line voltage control circuit 142A and a word line voltage control circuit 142B. The select line voltage control circuit 142A may generate the first voltage generating circuit control signals VG_signals 1 to control the voltage generating circuit 150 shown in FIG. 1 to generate the select line voltages $V_{DSL0}$, $V_{DSL1}$, $V_{DSL2}$, $V_{DSL3}$, $V_{SSL0}$, and $V_{SSL1}$ applied to a selected memory block during a read operation of a memory device in response to the internal control signal int_CS1. The word line voltage control circuit 142B may generate the second voltage generating circuit control signals VG_signals 2 to control the voltage generating circuit 150 shown in FIG. 1 to generate the read voltage Vread and the pass voltage Vpass applied to a selected memory block during a read operation of a memory device in response to the internal control signal int_CS2.

The address decoder control circuit 143 may output the address decoder control signals AD_signals to control the address decoder 120 shown in FIG. 1 during the general operations of a memory device in response to the internal control signal int_CS3.

The page buffer control circuit 144 may output the page buffer control signals PB_signals to control the read and write circuit 130 shown in FIG. 1 during the general operations of a memory device in response to the internal control signal int_CS4.

Figure 6:
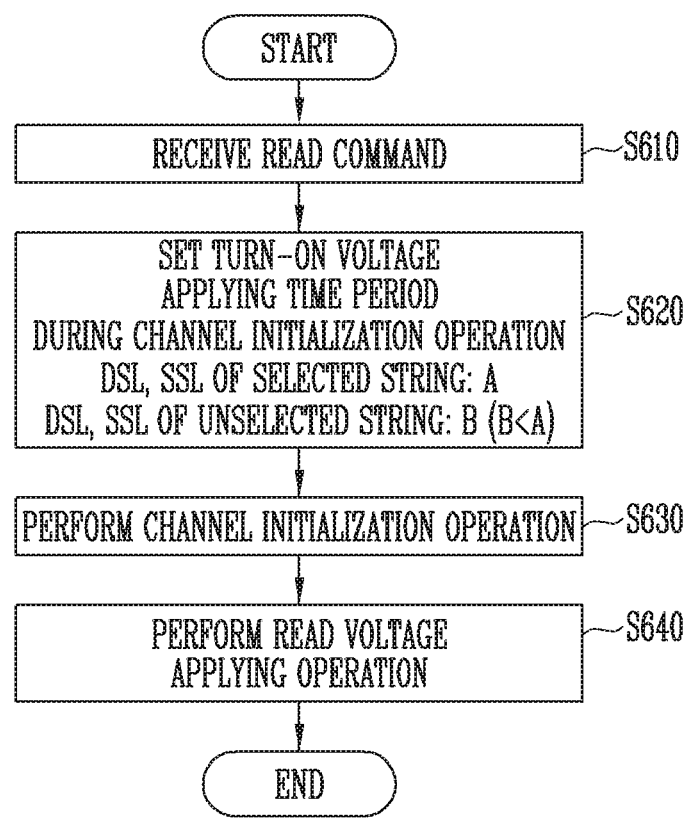
FIG. 6 is a flowchart illustrating a method of operating a memory device according to a first embodiment of the present disclosure.

FIG. 6 is a flowchart illustrating a method of operating a memory device according to a first embodiment of the present disclosure.

Figure 7:
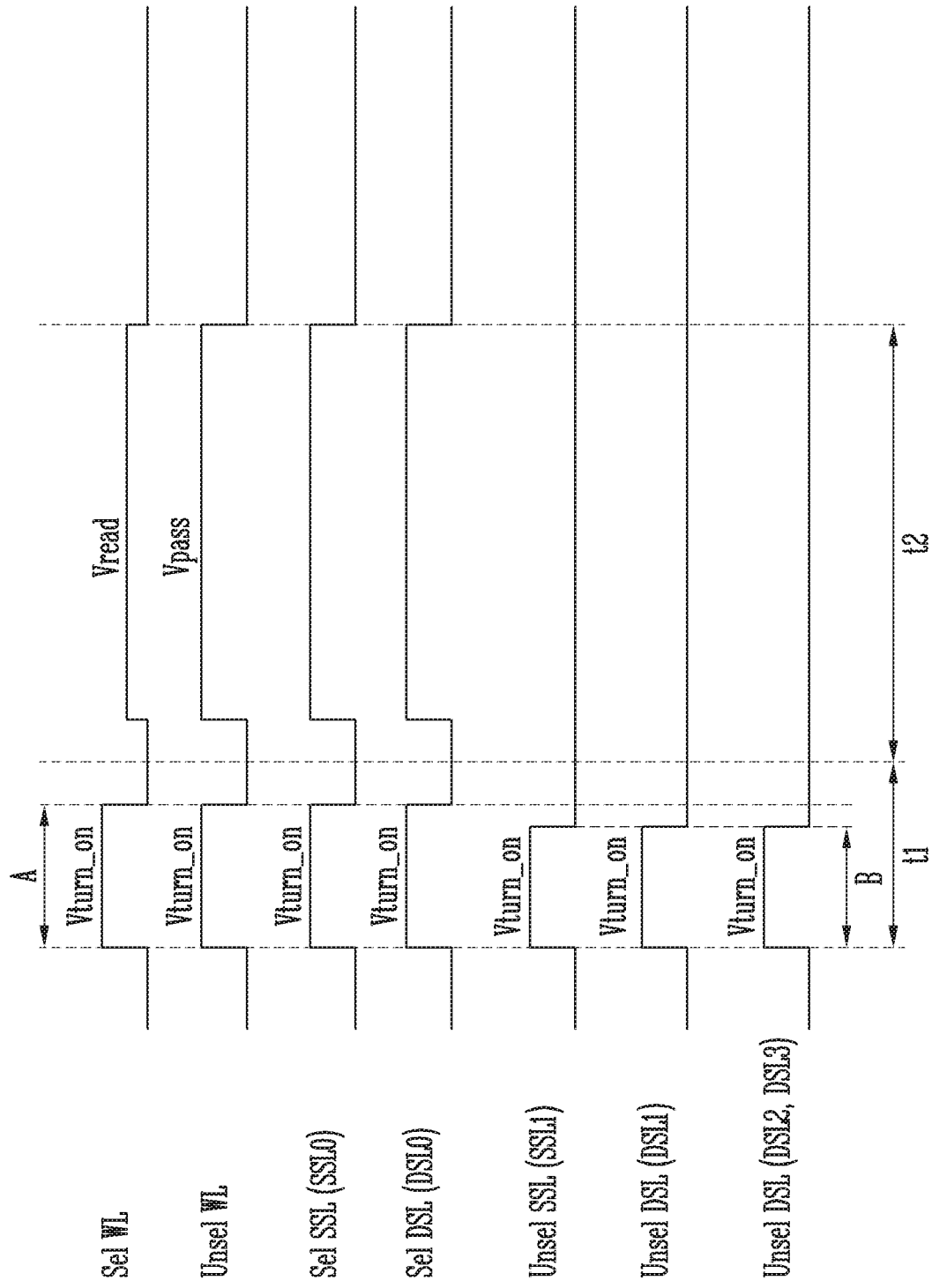
FIG. 7 is a waveform diagram of operating voltages illustrating a method of operating a memory device according to the first embodiment of the present disclosure.

FIG. 7 is a waveform diagram of operating voltages illustrating a method of operating a memory device according to a first embodiment of the present disclosure.

A method of operating a memory device according to a first embodiment is described below with reference to FIGS. 1 to 7.

The memory device 100 may receive the command CMD corresponding to a read operation and the address ADDR corresponding to the memory cells to perform the read operation from an external device (S610).

The memory device 100 may select one of the plurality of memory blocks BLK1 to BLKz included in the memory cell array 110 and a page and strings to perform the read operation of the selected memory block (for example, BLK1) in response to the received command CMD and address ADDR.

A case in which the string ST corresponding to the first drain select line DSL0 is a selected string and the strings ST corresponding to the remaining second, third, and fourth drain select lines DSL1, DSL2, and DSL3 are unselected strings will be described as an example.

The control logic 140 may set a time period A, for which a turn-on voltage Vturn_on is applied to the drain select transistor DST and the source select transistor SST of a selected string, and a time period B, for which the turn-on voltage Vturn_on is applied to the drain select transistor DST and the source select transistor SST of an unselected string, during a channel initialization operation t1 of a read operation, and the control logic 140 may set the time period A to be longer than the time period B (S620). The turn-on voltage Vturn_on may be greater than a voltage which turns on the drain select transistors DST and the source select transistors SST, that is, a threshold voltage of the drain select transistors DST and the source select transistors SST.

The memory device 100 may perform the channel initialization operation t1 of the read operation (S630).

For example, the voltage generating circuit 150 may generate the turn-on voltage Vturn_on according to the control of the first voltage generating circuit control signals VG_signals 1 output from the control logic 140 and output the turn-on voltage Vturn_on as the plurality of drain select line voltages VDSL0, VDSL1, VDSL2, and VDSL3 and the plurality of source select line voltages VSSL0 and VSSL1. The voltage generating circuit 150 may generate an operating voltage applied to the word lines WL1 to WLn as the turn-on voltage Vturn_on and output the turn on voltage Vturn_on according to the control of the second voltage generating circuit control signals VG_signals 2.

The address decoder 120 may apply a plurality of operating voltages including the plurality of drain select line voltages $V_{DSL0}$, $V_{DSL1}$, $V_{DSL2}$, and $V_{DSL3}$ and the plurality of source select line voltages $V_{SSL0}$ and $V_{SSL1}$ to the drain select transistors DST and the source select transistors SST of the selected memory block in response to the address decoder control signals AD_signals.

For example, the turn-on voltage Vturn_on may be applied to the first drain select line DSL0 and the first source select line SSL0 corresponding to the selected string for the time period A and the turn-on voltage Vturn_on may be applied to the second, third, and fourth drain select lines DSL1, DSL2, and DSL3 and the second source select line SSL1 corresponding to the unselected string for the time period B. In other words, the time period, for which the turn-on voltage Vturn_on is applied to the drain select transistor DST and the source select transistor SST of the selected string, may be longer than the time period, for which the turn-on voltage Vturn_on is applied to the drain select transistor DST and the source select transistor SST of the unselected string.

The memory device 100 may perform a read voltage applying operation t2 of the read operation (S640).

For example, the voltage generating circuit 150 and the address decoder 120 may discharge operating voltages applied to the word lines WLs, the first, second, third, and fourth drain select lines DSL0, DSL1, DSL2, and DSL3, and the first and second source select lines SSL0 and SSL1, and the respective plurality of page buffers PB1 to PBm of the read and write circuit 130 may precharge the corresponding bit lines BL1 to BLm to a set level.

Subsequently, the voltage generating circuit 150 may generate the read voltage Vread and the pass voltage Vpass to be applied to the word lines WL1 to WLn of the selected memory block in response to the second voltage generating circuit control signals VG_signals 2.

The address decoder 120 may apply the pass voltage Vpass to unselected word lines Unsel WL and apply the read voltage Vread to a selected word line Sel WL in response to the address decoder control signals AD_signals and the address ADDR. The turn-on voltage Vturn_on may be applied to the drain select transistor DST and the source select transistor SST corresponding to the selected string ST.

The read and write circuit 130 may perform the read operation by sensing a potential level or a current level of the bit lines BL1 to BLm in response to the page buffer control signals PB_signals.

Figure 8:
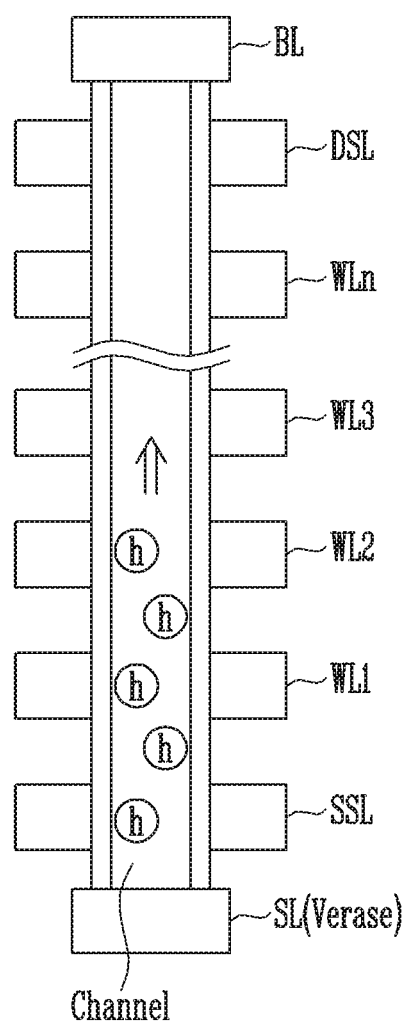
FIGS. 8 and 9 are cross-sectional diagrams of a string illustrating a method of operating a memory device according to an embodiment of the present disclosure.
Figure 9:
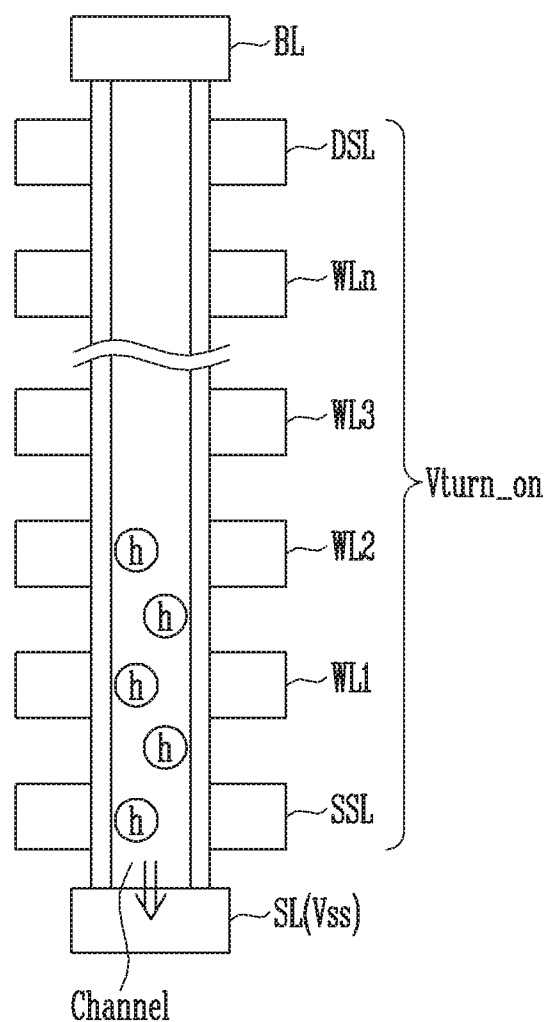

FIGS. 8 and 9 are cross-sectional diagrams of a string illustrating a method of operating a memory device according to an embodiment of the present disclosure.

FIG. 8 illustrates one of a plurality of strings included in an unselected memory block during an erase operation. The plurality of memory blocks BLK1 to BLKz as described with reference to FIGS. 1, 2, and 3 may share the source line SL. Accordingly, a hot hole (h) may be introduced into a channel of the strings included in the unselected memory block by an erase voltage Verase applied to the source line SL during an erase operation of a selected memory block among the plurality of memory blocks BLK1 to BLKz.

FIG. 9 illustrates one of a plurality of strings included in a selected memory block during a channel initialization operation of a read operation. The turn-on voltage Vturn_on may be applied to the drain select transistor DST, the plurality of memory cells F1 to Fn, and the source select transistor SST of the strings ST included in a selected memory block during a channel initialization operation. Accordingly, the drain select transistor DST, the plurality of memory cells F1 to Fn, and the source select transistor SST of the selected memory block may be turned on and the channel Channel of the strings ST included in the selected memory block may be electrically coupled to the source line SL having a level of a ground voltage Vss to remove hot holes (h) from the channel.

According to a first embodiment of the present disclosure, a time period, for which a turn-on voltage is applied to a source select transistor and a drain select transistor of a selected string, may be adjusted to be longer than a time period, for which a turn-on voltage is applied to a source select transistor and a drain select transistor of an unselected string, during a channel initialization operation. Accordingly, the turn-on voltage may be applied to the drain select transistor and the source select transistor of the selected string for a sufficient time to effectively remove hot holes (h) remaining in the channel, and the turn-on voltage may be applied to the drain select transistor and the source select transistor of the unselected string for a short time to prevent deterioration of a boosting phenomenon during a read voltage applying operation subsequent to the channel initialization operation, therefore, a read disturb phenomenon may be improved.

Figure 10:
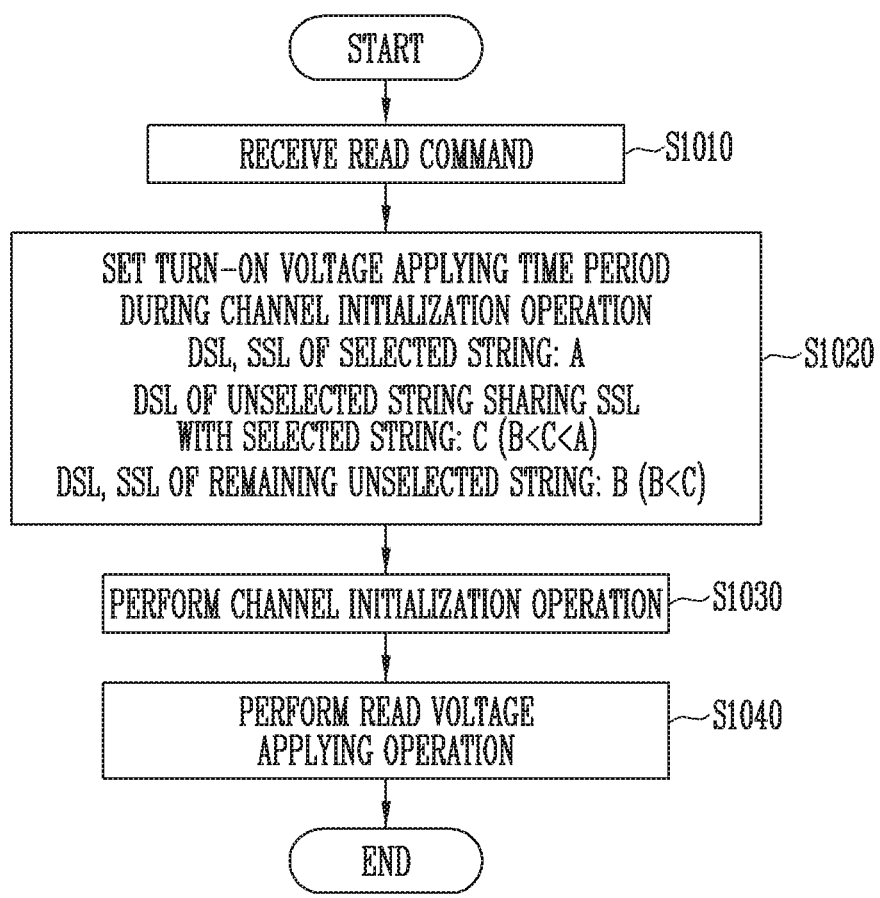
FIG. 10 is a flowchart illustrating a method of operating a memory device according to a second embodiment of the present disclosure.

FIG. 10 is a flowchart illustrating a method of operating a memory device according to a second embodiment of the present disclosure.

Figure 11:
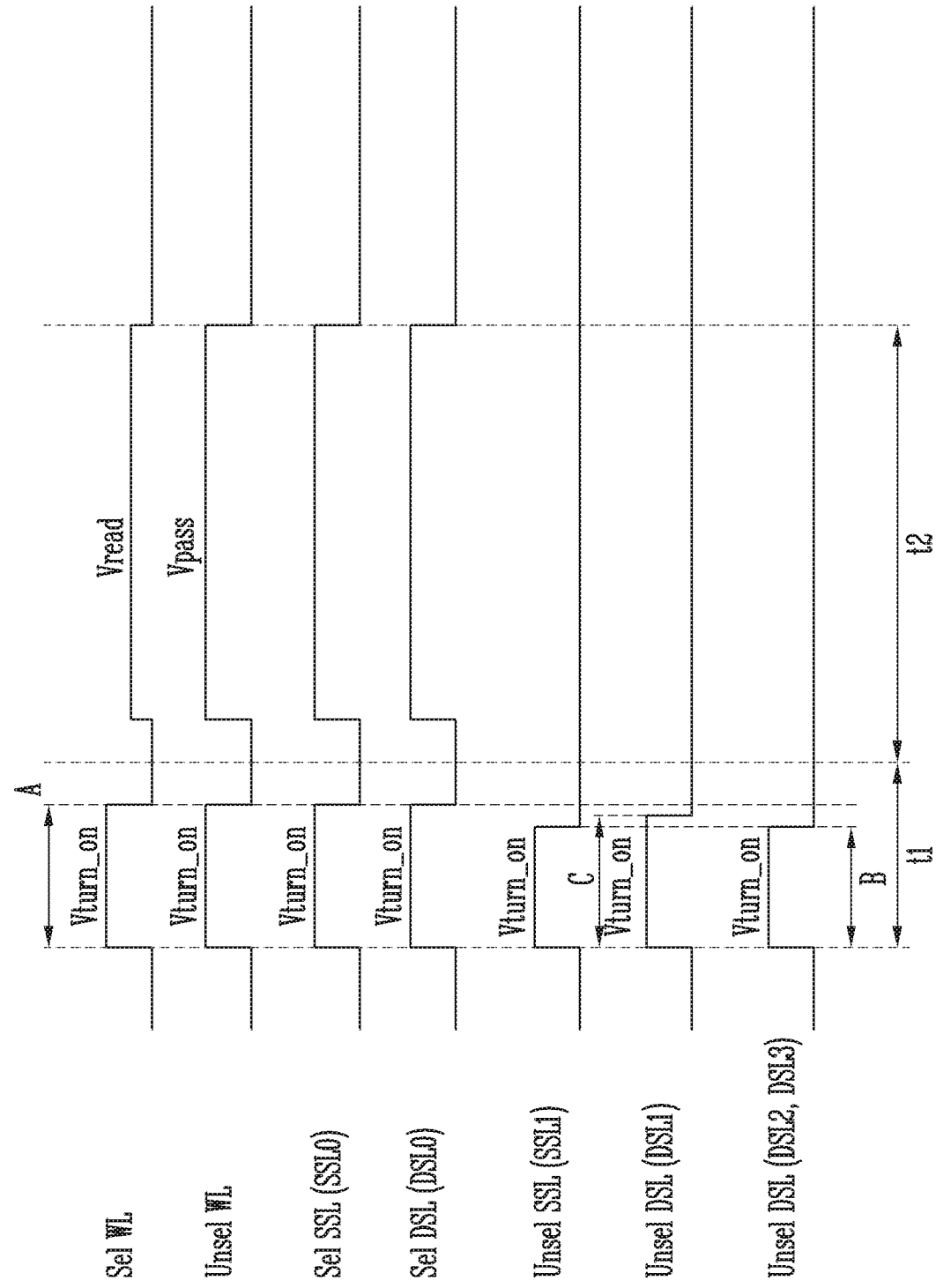
FIG. 11 is a waveform diagram of operating voltages illustrating a method of operating a memory device according to the second embodiment of the present disclosure.

FIG. 11 is a waveform diagram of operating voltages illustrating a method of operating a memory device according to a second embodiment of the present disclosure.

A method of operating a memory device according to a second embodiment of the present disclosure is described below with reference to FIGS. 1 to 5, 10, and 11.

The memory device 100 may receive the command CMD corresponding to a read operation and the address ADDR corresponding to the memory cells to perform the read operation from an external device (S1010).

The memory device 100 may select one of the plurality of memory blocks BLK1 to BLKz included in the memory cell array 110, and a page and strings to perform the read operation of the selected memory block (for example, BLK1) in response to the received command CMD and address ADDR.

A case in which the string ST corresponding to the first drain select line DSL0 is a selected string and the strings ST corresponding to the remaining second, third, and fourth drain select lines DSL1, DSL2, and DSL3 are unselected strings will be described as an example.

The control logic 140 may set the time period A, for which the turn-on voltage Vturn_on is applied to the drain select transistor DST and the source select transistor SST of the selected string, the time period C, for which the turn-on voltage Vturn_on is applied to the drain select transistor DST of the unselected string sharing the source select line SSL0 with the selected string, and the time period B, for which the turn-on voltage Vturn_on is applied to the drain select transistor DST and the source select transistor SST of remaining unselected strings, during the channel initialization operation t1 of the read operation (S1020). The time period C may be set to be shorter than the time period A and the time period B may be set to be shorter than the time period C. The turn-on voltage Vturn_on may be greater than a voltage which turns on the drain select transistors DST and the source select transistors SST, that is, a threshold voltage of the drain select transistors DST and the source select transistors SST.

The memory device 100 may perform the channel initialization operation t1 of the read operation (S1030).

For example, the voltage generating circuit 150 may generate the turn-on voltage Vturn_on according to the control of the first voltage generating circuit control signals VG_signals 1 output from the control logic 140 and output the turn-on voltage Vturn_on as the plurality of drain select line voltages $V_{DSL0}$, $V_{DSL1}$, $V_{DSL2}$, and $V_{DSL3}$ and the plurality of source select line voltages $V_{SSL0}$ and $V_{SSL1}$. The voltage generating circuit 150 may generate an operating voltage applied to the word lines WL1 to WLn as the turn-on voltage Vturn_on and output the turn-on voltage Vturn_on according to the control of the second voltage generating circuit control signals VG_signals 2.

The address decoder 120 may apply a plurality of operating voltages including the plurality of drain select line voltages $V_{DSL0}$, $V_{DSL1}$, $V_{DSL2}$, and $V_{DSL3}$ and the plurality of source select line voltages $V_{SSL0}$ and $V_{SSL1}$ to the drain select transistors DST and the source select transistors SST of the selected memory block in response to the address decoder control signals AD_signals.

For example, the turn-on voltage Vturn_on may be applied to the first drain select line DSL0 and the first source select line SSL0 corresponding to the selected string for the time period A, the turn-on voltage Vturn_on may be applied to the drain select line DSL1 of the string sharing the source select line SSL0 with the selected string among the unselected strings for the time period C, and the turn-on voltage Vturn_on may be applied to the drain select lines DSL2 and DSL3 and the source select line SSL1 of remaining unselected strings for the time period B.

The memory device 100 may perform the read voltage applying operation t2 of the read operation (S1040).

For example, the voltage generating circuit 150 and the address decoder 120 may discharge operating voltages applied to the word lines WLs, the first, second, third, and fourth drain select lines DSL0, DSL1, DSL2, and DSL3, and the first and second source select lines SSL0 and SSL1 and the respective plurality of page buffers PB1 to PBm of the read and write circuit 130 may precharge the corresponding bit lines BL1 to BLm to a set level.

Subsequently, the voltage generating circuit 150 may generate the read voltage Vread and the pass voltage Vpass to be applied to the word lines WL1 to WLn of the selected memory block in response to the second voltage generating circuit control signals VG_signals 2.

The address decoder 120 may apply the pass voltage Vpass to the unselected word lines Unsel WL and apply the read voltage Vread to the selected word line Sel WL in response to the address decoder control signals AD_signals and the address ADDR. The turn-on voltage Vturn_on may be applied to the drain select transistor DST and the source select transistor SST corresponding to the selected string ST.

The read and write circuit 130 may perform the read operation by sensing a potential level or a current level of the bit lines BL1 to BLm in response to the page buffer control signals PB_signals.

According to the second embodiment of the present disclosure as described above, the turn-on voltage Vturn_on may be applied to the drain select transistor DST, the plurality of memory cells F1 to Fn, and the source select transistor SST of the strings ST included in a selected memory block during a channel initialization operation. Accordingly, the drain select transistor DST, the plurality of memory cells F1 to Fn, and the source select transistor SST of the selected memory block may be turned on and the channel Channel of the strings ST included in the selected memory block may be electrically coupled to the source line SL having a level of the ground voltage Vss to remove hot holes from the channel. In addition, a time period, for which a turn-on voltage is applied to a drain select transistor of a string sharing a source line with a selected string among unselected strings, may be adjusted to be longer than a time period, for which the turn-on voltage is applied to a source select transistor and a drain select transistor of remaining unselected strings, such that a read disturb phenomenon may further be improved.

Figure 12:
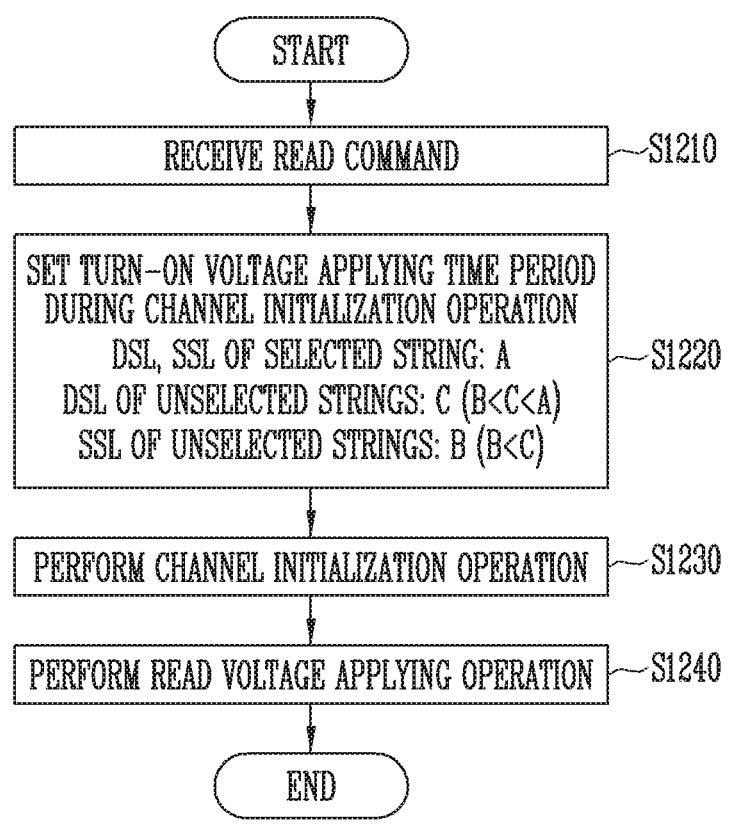
FIG. 12 is a flowchart illustrating a method of operating a memory device according to a third embodiment of the present disclosure.

FIG. 12 is a flowchart illustrating a method of operating a memory device according to a third embodiment of the present disclosure.

Figure 13:
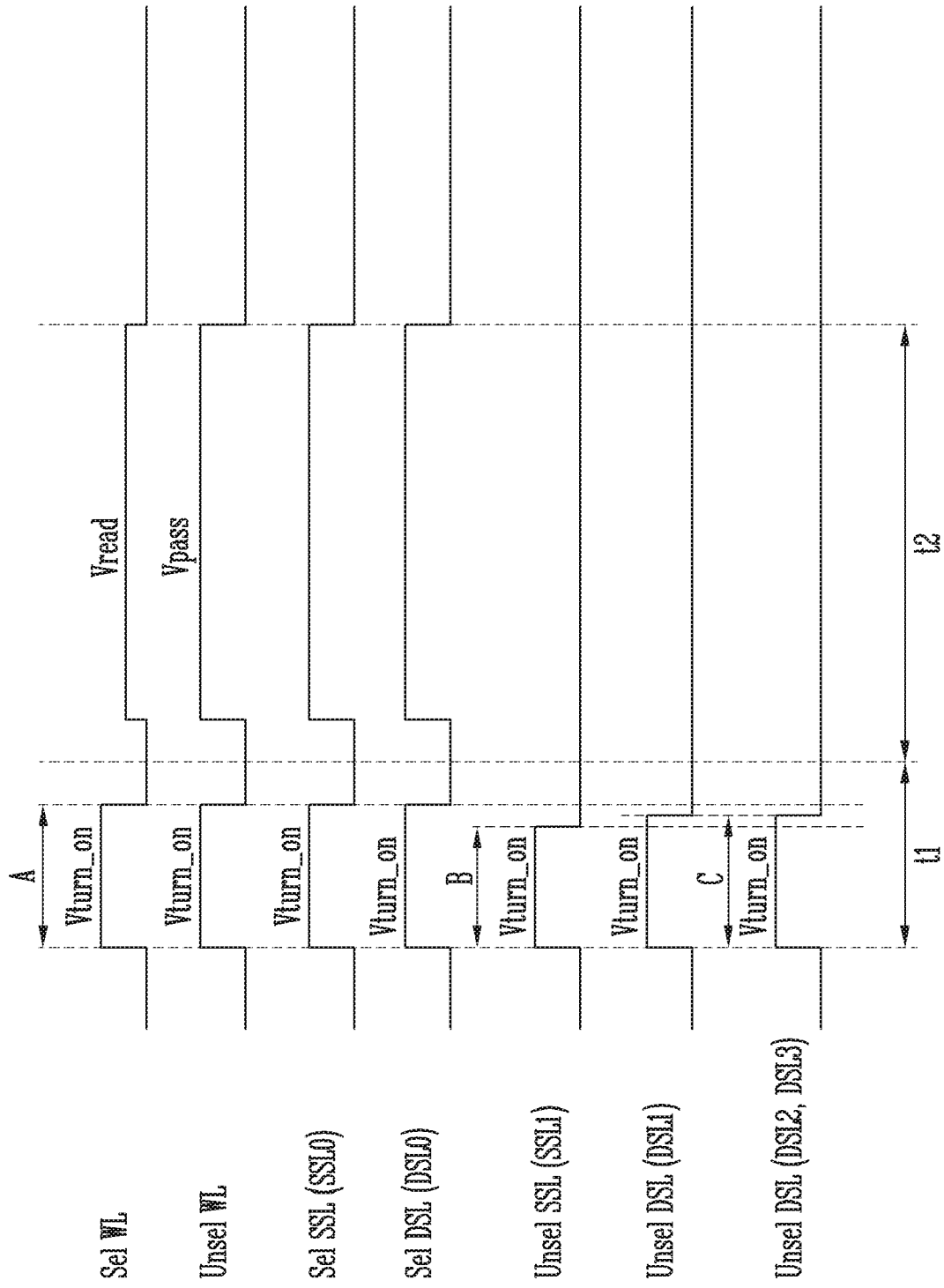
FIG. 13 is a waveform diagram of operating voltages illustrating a method of operating a memory device according to the third embodiment of the present disclosure.

FIG. 13 is a waveform diagram of operating voltages illustrating a method of operating a memory device according to a third embodiment of the present disclosure.

A method of operating a memory device according to a third embodiment of the present disclosure is described below with reference to FIGS. 1 to 5, 12, and 13.

The memory device 100 may receive the command CMD corresponding to a read operation and the address ADDR corresponding to the memory cells to perform the read operation from an external device (S1210).

The memory device 100 may select one of the plurality of memory blocks BLK1 to BLKz included in the memory cell array 110, and a page and strings to perform the read operation of the selected memory block (for example, BLK1) in response to the received command CMD and address ADDR.

A case in which the string ST corresponding to the first drain select line DSL0 is a selected string and the strings ST corresponding to the remaining second, third, and fourth drain select lines DSL1, DSL2, and DSL3 are unselected strings will be described as an example.

The control logic 140 may set the time period A, for which the turn-on voltage Vturn_on is applied to the drain select transistor DST and the source select transistor SST of the selected string, the time period C, for which the turn-on voltage Vturn_on is applied to the drain select transistor of the unselected string, and the time period B, for which the turn-on voltage Vturn_on is applied to the source select transistor of the unselected string, during the channel initialization operation t1 of the read operation (S1220). The time period C may be set to be shorter than the time period A and the time period B may be set to be shorter than the time period C. The turn-on voltage Vturn_on may be greater than a voltage which turns on the drain select transistors DST and the source select transistors SST, that is, a threshold voltage of the drain select transistors DST and the source select transistors SST.

The memory device 100 may perform the channel initialization operation t1 of the read operation (S1230).

For example, the voltage generating circuit 150 may generate the turn-on voltage Vturn_on according to the control of the first voltage generating circuit control signals VG_signals 1 output from the control logic 140 and output the turn-on voltage Vturn_on as the plurality of drain select line voltages $V_{DSL0}$, $V_{DSL1}$, $V_{DSL2}$, and $V_{DSL3}$ and the plurality of source select line voltages VSSL0 and VSSL1. The voltage generating circuit 150 may generate an operating voltage applied to the word lines WL1 to WLn as the turn-on voltage Vturn_on and output the turn-on voltage Vturn_on according to the control of the second voltage generating circuit control signals VG_signals 2.

The address decoder 120 may apply a plurality of operating voltages including the plurality of drain select line voltages $V_{DSL0}$, $V_{DSL1}$, $V_{DSL2}$, and $V_{DSL3}$ and the plurality of source select line voltages VSSL0 and VSSL1 to the drain select transistors DST and the source select transistors SST of the selected memory block in response to the address decoder control signals AD_signals.

For example, the turn-on voltage Vturn_on may be applied to the first drain select line DSL0 and the first source select line SSL0 corresponding to the selected string for the time period A, the turn-on voltage Vturn_on may be applied to the drain select lines DSL1, DSL2, and DSL3 of the unselected string for the time period C, and the turn-on voltage Vturn_on may be applied to the source select line SSL1 of the unselected string for the time period B.

The memory device 100 may perform the read voltage applying operation t2 of the read operation (S1240).

For example, the voltage generating circuit 150 and the address decoder 120 may discharge operating voltages applied to the word lines WLs, the first, second, third, and fourth drain select lines DSL0, DSL1, DSL2, and DSL3, and the first and second source select lines SSL0 and SSL1 and the respective plurality of page buffers PB1 to PBm of the read and write circuit 130 may precharge the corresponding bit lines BL1 to BLm to a set level.

Subsequently, the voltage generating circuit 150 may generate the read voltage Vread and the pass voltage Vpass to be applied to the word lines WL1 to WLn of the selected memory block in response to the second voltage generating circuit control signals VG_signals 2.

The address decoder 120 may apply the pass voltage Vpass to the unselected word lines Unsel WL and apply the read voltage Vread to the selected word line Sel WL in response to the address decoder control signals AD_signals and the address ADDR. The turn-on voltage Vturn_on may be applied to the drain select transistor DST and the source select transistor SST corresponding to the selected string ST.

The read and write circuit 130 may perform the read operation by sensing a potential level or a current level of the bit lines BL1 to BLm in response to the page buffer control signals PB_signals.

According to the third embodiment of the present disclosure as described above, the turn-on voltage Vturn_on may be applied to the drain select transistor DST, the plurality of memory cells F1 to Fn, and the source select transistor SST of the strings ST included in a selected memory block during a channel initialization operation. Accordingly, the drain select transistor DST, the plurality of memory cells F1 to Fn, and the source select transistor SST of the selected memory block may be turned on and the channel Channel of the strings ST included in the selected memory block may be electrically coupled to the source line SL having a level of the ground voltage Vss to remove hot holes from the channel. In addition, the time period C, for which the turn-on voltage Vturn_on is applied to the drain select lines DSL1, DSL2, and DSL3 of the unselected strings, may be set to be longer than the time period B, for which the turn-on voltage Vturn_on is applied to the source select line SSL1 of the unselected strings. Accordingly, when a size of the source select transistor SST and a size of the drain select transistor DST are different, a time period, for which the turn-on voltage Vturn_on is applied to the source select transistor SST, and a time period, for which the turn-on voltage Vturn_on is applied to the drain select transistor DST, may be adjusted to be different from each other.

The first, second, and third embodiments as described above may be combined and performed. For example, the first embodiment and the second embodiment may be combined or the first embodiment and the third embodiment may be combined to perform a channel initialization operation, the second embodiment and the third embodiment may be combined and performed, and the first, second, and third embodiments may be combined and performed during a read operation.

Figure 14:
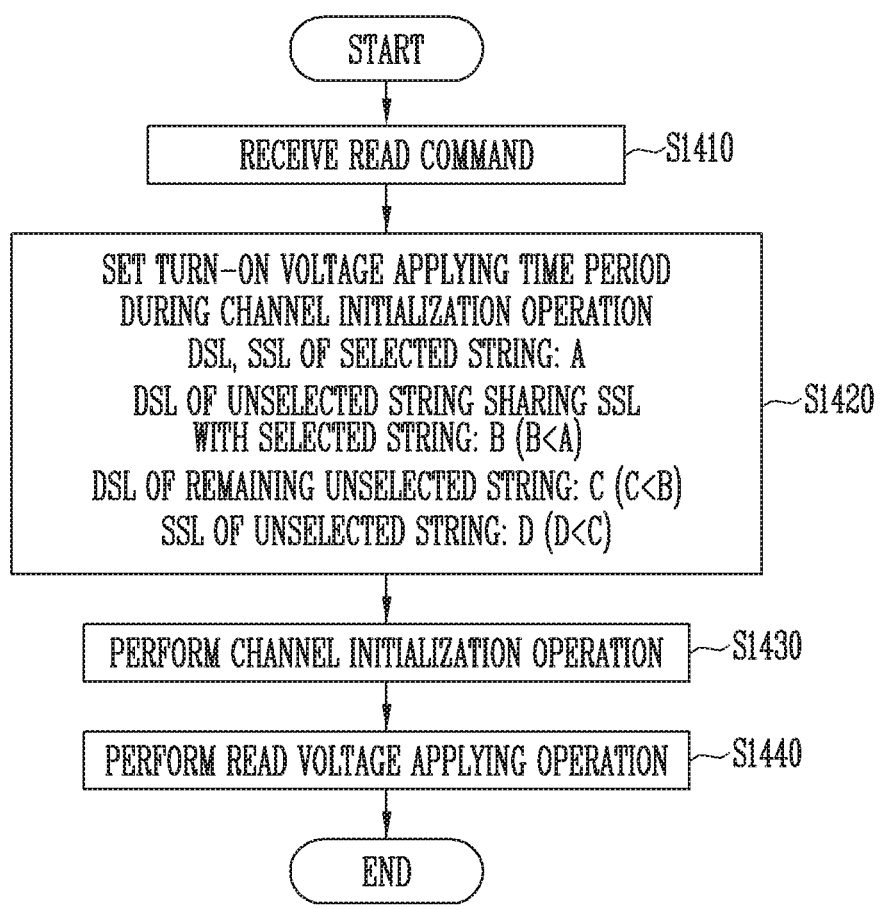
FIG. 14 is a flowchart illustrating a method of operating a memory device according to a fourth embodiment of the present disclosure.

FIG. 14 is a flowchart illustrating a method of operating a memory device according to a fourth embodiment of the present disclosure.

Figure 15:
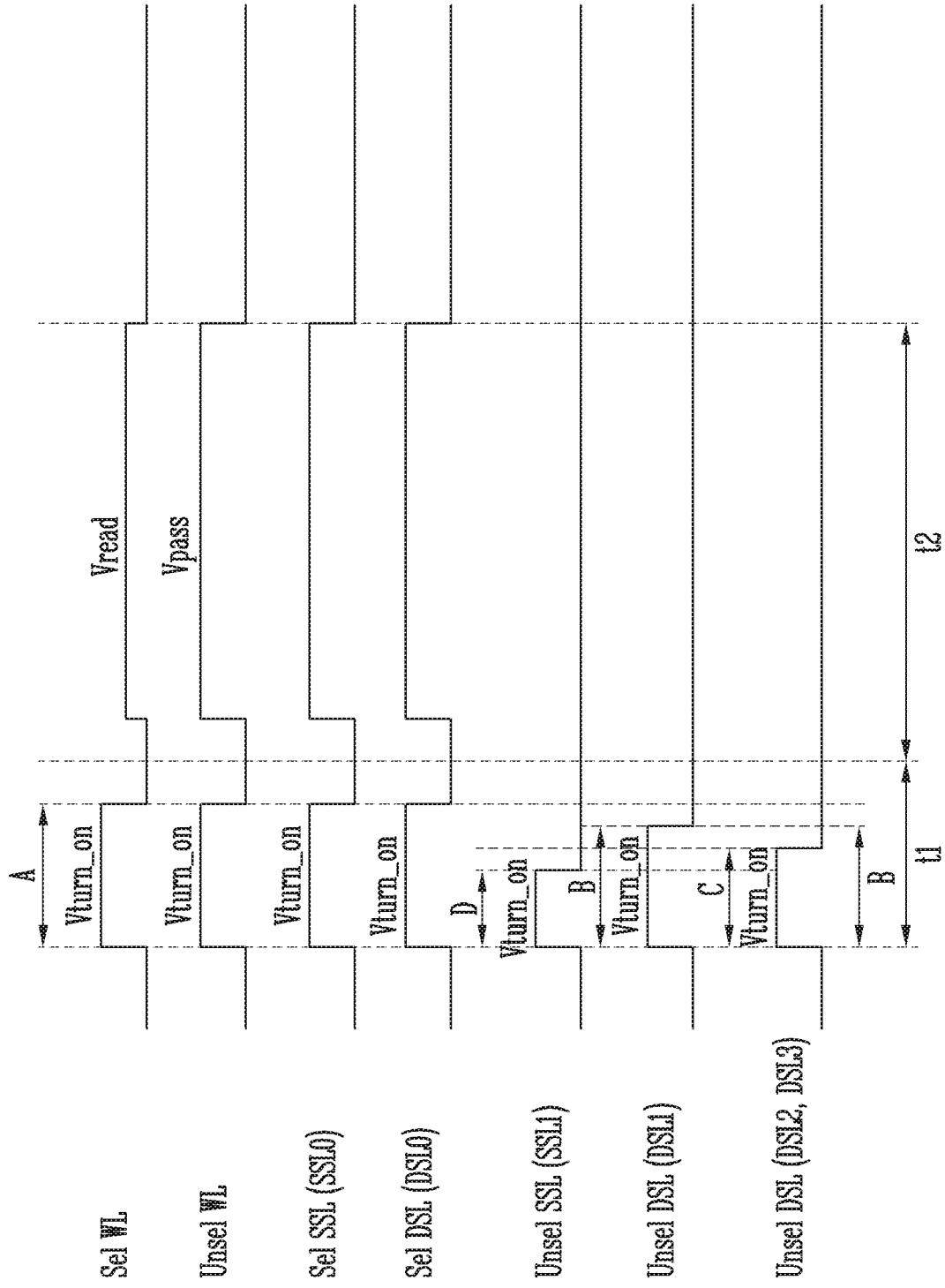
FIG. 15 is a waveform diagram of operating voltages illustrating a method of operating a memory device according to the fourth embodiment of the present disclosure.

FIG. 15 is a waveform diagram of operating voltages illustrating a method of operating a memory device according to a fourth embodiment of the present disclosure.

A method of operating a memory device according to a fourth embodiment of the present disclosure is described below with reference to FIGS. 1 to 5, 14, and 15.

The memory device 100 may receive the command CMD corresponding to a read operation and the address ADDR corresponding to the memory cells to perform the read operation from an external device (S1410).

The memory device 100 may select one of the plurality of memory blocks BLK1 to BLKz included in the memory cell array 110, and a page and strings to perform the read operation of the selected memory block (for example, BLK1) in response to the received command CMD and address ADDR.

A case in which the string ST corresponding to the first drain select line DSL0 is a selected string and the strings ST corresponding to the remaining second, third, and fourth drain select lines DSL1, DSL2, and DSL3 are unselected strings will be described as an example.

The control logic 140 may set the time period A, for which the turn-on voltage Vturn_on is applied to the drain select transistor DST and the source select transistor SST of the selected string, the time period B, for which the turn-on voltage Vturn_on is applied to the drain select transistor DST of the unselected string sharing the source select line SSL0 with the selected string, the time period C, for which the turn-on voltage Vturn_on is applied to the drain select transistor DST of the remaining unselected strings, and the time period D, for which the turn-on voltage Vturn_on is applied to the source select transistor SST of the remaining unselected strings, during the channel initialization operation t1 of the read operation (S1420). The time period B may be set to be shorter than the time period A, the time period C may be set to be shorter than the time period B, and the time period D may be set to be shorter than the time period C. The turn-on voltage Vturn_on may be greater than a voltage which turns on the drain select transistors DST and the source select transistors SST, that is, a threshold voltage of the drain select transistors DST and the source select transistors SST.

The memory device 100 may perform the channel initialization operation t1 of the read operation (S1430).

For example, the voltage generating circuit 150 may generate the turn-on voltage Vturn_on according to the control of the first voltage generating circuit control signals VG_signals 1 output from the control logic 140 and output the turn-on voltage Vturn_on as the plurality of drain select line voltages VDSL0, VDSL1, VDSL2, and VDSL3 and the plurality of source select line voltages VSSL0 and VSSL1. The voltage generating circuit 150 may generate an operating voltage applied to the word lines WL1 to WLn as the turn-on voltage Vturn_on and output the turn on voltage Vturn_on according to the control of the second voltage generating circuit control signals VG_signals 2.

The address decoder 120 may apply a plurality of operating voltages including the plurality of drain select line voltages VDSL0, VDSL1, VDSL2, and VDSL3 and the plurality of source select line voltages VSSL0 and VSSL1 to the drain select transistors DST and the source select transistors SST of the selected memory block in response to the address decoder control signals AD_signals.

For example, the turn-on voltage Vturn_on may be applied to the first drain select line DSL0 and the first source select line SSL0 corresponding to the selected string for the time period A, the turn-on voltage Vturn_on may be applied to the drain select line DSL1 of the string sharing the source select line SSL0 with the selected string among the unselected strings for the time period B, the turn-on voltage Vturn_on may be applied to the drain select lines DSL2 and DSL3 of the remaining unselected strings for the time period C, and the turn-on voltage Vturn_on may be applied to the source select line SSL1 of the remaining unselected strings for the time period D.

The memory device 100 may perform the read voltage applying operation t2 during the read operation (S1440).

For example, the voltage generating circuit 150 and the address decoder 120 may discharge operating voltages applied to the word lines WLs, the first, second, third, and fourth drain select lines DSL0, DSL1, DSL2, and DSL3, and the first and second source select lines SSL0 and SSL1 and the respective plurality of page buffers PB1 to PBm of the read and write circuit 130 may precharge the corresponding bit lines BL1 to BLm to a set level.

Subsequently, the voltage generating circuit 150 may generate the read voltage Vread and the pass voltage Vpass to be applied to the word lines WL1 to WLn of the selected memory block in response to the second voltage generating circuit control signals VG_signals 2.

The address decoder 120 may apply the pass voltage Vpass to the unselected word lines Unsel WL and apply the read voltage Vread to the selected word line Sel WL in response to the address decoder control signals AD_signals and the address ADDR. The turn-on voltage Vturn_on may be applied to the drain select transistor DST and the source select transistor SST corresponding to the selected string ST.

The read and write circuit 130 may perform the read operation by sensing a potential level or a current level of the bit lines BL1 to BLm in response to the page buffer control signals PB_signals.

According to the fourth embodiment of the present disclosure as described above, the turn-on voltage Vturn_on may be applied to the drain select transistor DST, the plurality of memory cells F1 to Fn, and the source select transistor SST of the strings ST included in a selected memory block during a channel initialization operation. Accordingly, the drain select transistor DST, the plurality of memory cells F1 to Fn, and the source select transistor SST of the selected memory block may be turned on and the channel Channel of the strings ST included in the selected memory block may be electrically coupled to the source line SL having a level of the ground voltage Vss to remove hot holes from the channel. Accordingly, the turn-on voltage may be applied to the drain select transistor and the source select transistor of the selected string for a sufficient time to effectively remove the hot holes (h) remaining in the channel, and the turn-on voltage may be applied to the drain select transistor and the source select transistor of the unselected string for a short time to prevent deterioration of a boosting phenomenon during a read voltage applying operation subsequent to the channel initialization operation, therefore, a read disturb phenomenon may be improved. In addition, a time period, for which a turn-on voltage is applied to a drain select transistor of a string sharing a source line with a selected string among the unselected strings, may be adjusted to be longer than a time period, for which a turn-on voltage is applied to a source select transistor and a drain select transistor of remaining unselected strings, such that the read disturb phenomenon may further be improved. In addition, a time period, for which a turn-on voltage is applied to a drain select line of unselected strings, may be set to be longer than a time period, for which a turn-on voltage is applied to a source select line of the unselected strings. Accordingly, when a size of a source select transistor and a size of a drain select transistor are different, a time period, for which a turn-on voltage is applied to the source select transistor, and a time period, for which a turn-on voltage is applied to the drain select transistor, may be adjusted to be different from each other.

Figure 16:
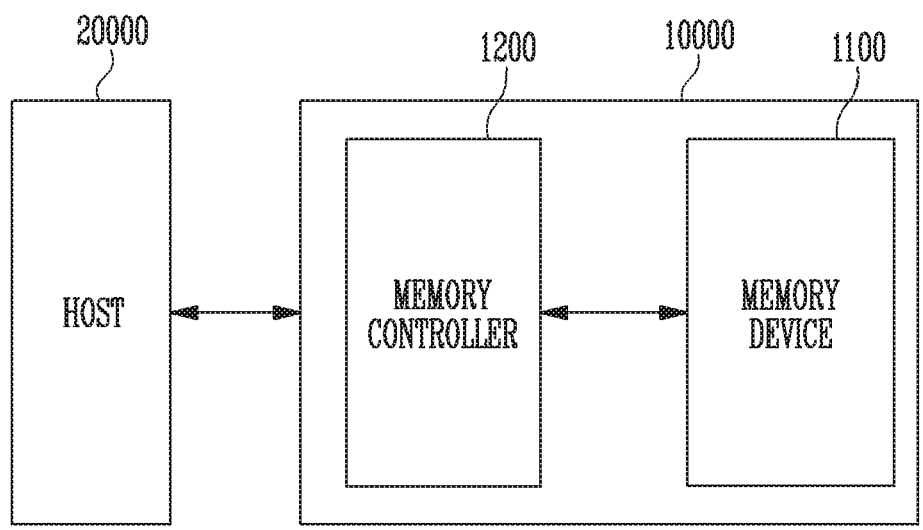
FIG. 16 is a diagram illustrating a memory system including the memory device shown in FIG. 1.

FIG. 16 is a diagram illustrating a memory system 10000 including the memory device shown in FIG. 1.

Referring to FIG. 16, the memory system 10000 may include a memory device 1100 for storing data and a memory controller 1200 controlling the memory device 1100 in response to control of a host 20000.

The host 20000 may communicate with the memory system 10000 using an interface protocol such as Peripheral Component Interconnect-Express (PCI-E), Advanced Technology Attachment (ATA), Serial ATA (SATA), Parallel ATA (PATA), or a serial attached SCSI (SAS). In addition, the interface protocols provided for the purpose of data communication between the host 20000 and the memory system 10000 may not be limited to the above examples and may be one of interface protocols such as a Universal Serial Bus (USB), a Multi-Media Card (MMC), an Enhanced Small Disk Interface (ESDI), and Integrated Drive Electronics (IDE).

The memory controller 1200 may control the general operations of the memory system 10000 and control data exchange between the host 20000 and the memory device 1100. For example, the memory controller 1200 may control the memory device 1100 to program or read data in response to a request from the host 20000. In addition, the memory controller 1200 may store information about main memory blocks and sub-memory blocks included in the memory device 1100, and select the memory device 1100 to perform a program operation on a main memory block or a sub-memory block according to the amount of data loaded for the program operation. According to an embodiment, the memory device 1100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), or flash memory. The memory device 1100 may be configured and operated in the same manner as the memory device 100 shown in FIG. 1. The memory device 1100 may perform a program operation, a read operation, or an erase operation under the control of the memory controller 1200.

Figure 17:
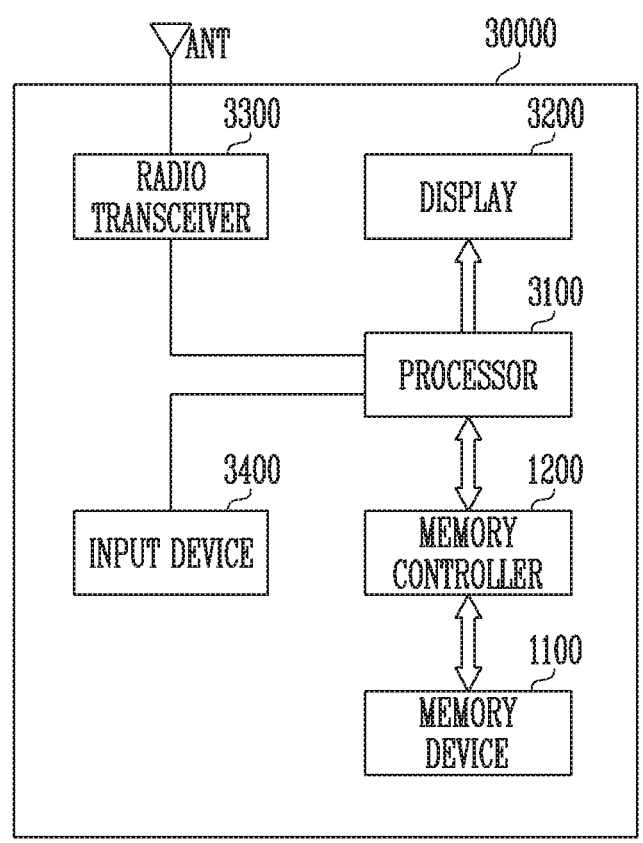
FIGS. 17 to 20 are diagrams illustrating other embodiments of a memory system including the memory device shown in FIG. 1.

FIG. 17 is a diagram illustrating another embodiment of a memory system.

Referring to FIG. 17, a memory system 30000 may be embodied into a cellular phone, a smartphone, a tablet PC, a personal digital assistant (PDA), or a wireless communication device. The memory system 30000 may include the memory device 1100 and the memory controller 1200 controlling the operations of the memory device 1100. The memory controller 1200 may control a data access operation of the memory device 1100, for example, a program operation, an erase operation, or a read operation in response to control of a processor 3100.

The memory controller 1200 may control data programmed into the memory device 1100 to be output through a display 3200. The memory device 1100 may be configured and operated in the same manner as the memory device 100 shown in FIG. 1.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the memory device 1100. In addition, the radio transceiver 3300 may change a signal output from the processor 3100 to a radio signal and output the radio signal to an external device through the antenna ANT. A control signal for controlling the operations of the processor 3100 or data to be processed by the processor 3100 may be input by an input device 3400, and the input device 3400 may include a pointing device such as a touch pad, a computer mouse, a keypad, or a keyboard. The processor 3100 may control the operations of the display 3200 so that data output from the memory controller 1200, data output from the radio transceiver 3300, or data output from the input device 3400 may be output through the display 3200.

According to an embodiment, the memory controller 1200 controlling the operations of the memory device 1100 may form part of the processor 3100, or be formed as a separate chip from the processor 3100.

Figure 18:
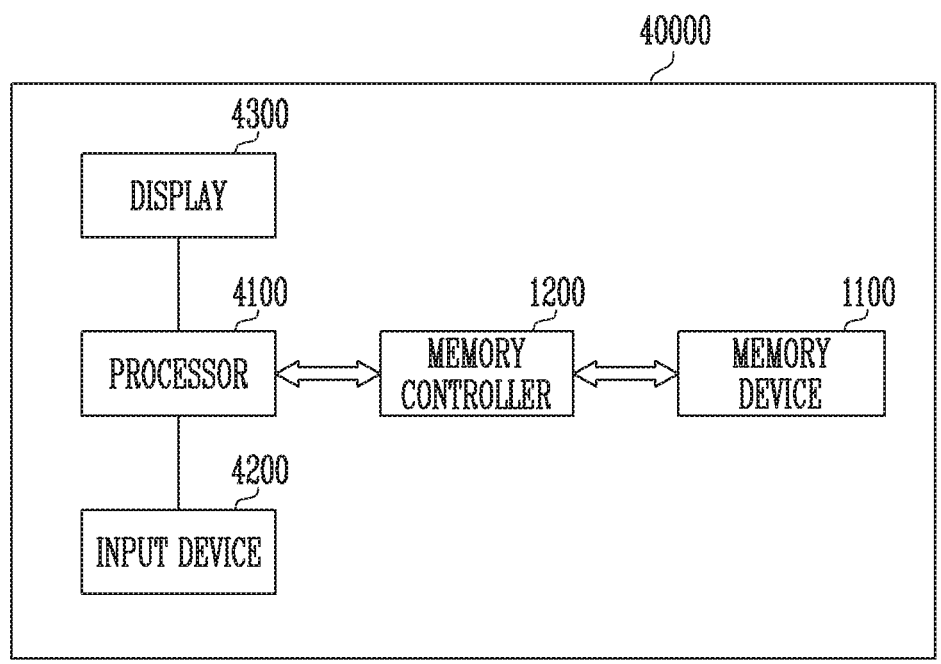

FIG. 18 is a diagram illustrating another embodiment of a memory system.

Referring to FIG. 18, a memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100. The memory device 1100 may be configured and operated in the same manner as the memory device 100 shown in FIG. 1.

A processor 4100 may output data stored in the memory device 1100 through a display 4300 according to data input through an input device 4200. Examples of the input device 4200 may include a pointing device such as a touch pad, a computer mouse, a keypad, or a keyboard.

The processor 4100 may control the general operations of the memory system 40000 and control the operations of the memory controller 1200. According to an embodiment, the memory controller 1200 controlling the operations of the memory device 1100 may form part of the processor 4100, or be formed as a separate chip from the processor 4100.

Figure 19:
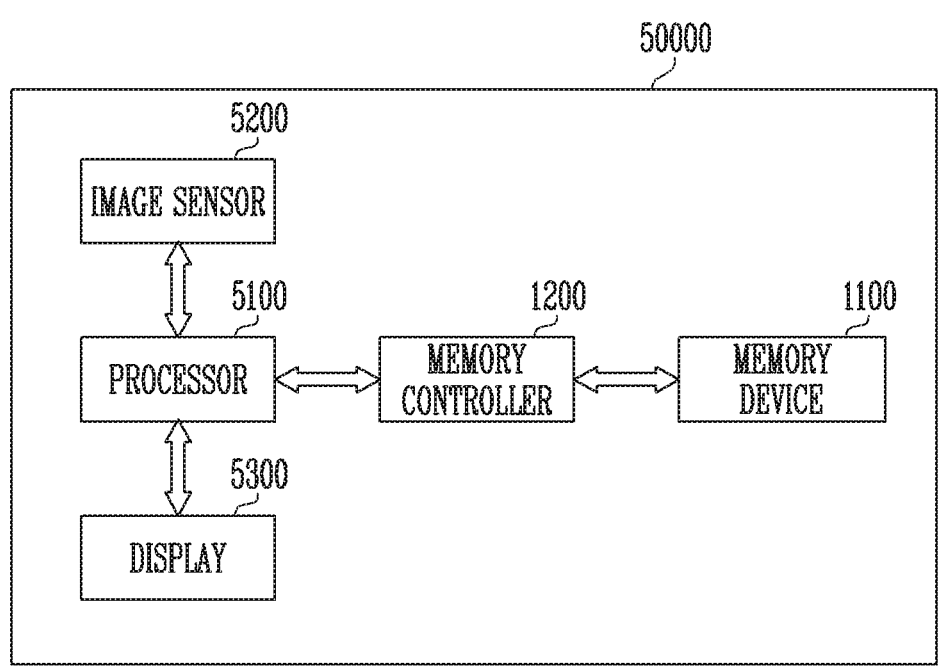

FIG. 19 is a diagram illustrating another embodiment of a memory system.

Referring to FIG. 19, a memory system 50000 may be embodied into an image processor, for example, a digital camera, a cellular phone with a digital camera attached thereto, a smartphone with a digital camera attached thereto, or a tablet PC with a digital camera attached thereto.

The memory system 50000 may include the memory device 1100 and the memory controller 1200 controlling a data processing operation of the memory device 1100, for example, a program operation, an erase operation, or a read operation. The memory device 1100 may be configured and operated in the same manner as the memory device 100 shown in FIG. 1.

An image sensor 5200 of the memory system 50000 may convert an optical image into digital signals, and the digital signals may be transferred to a processor 5100 or the memory controller 1200. In response to control of the processor 5100, the digital signals may be output through a display 5300 or stored in the memory device 1100 through the memory controller 1200. In addition, the data stored in the memory device 1100 may be output through the display 5300 according to control of the processor 5100 or the memory controller 1200.

According to an embodiment, the memory controller 1200 controlling the operations of the memory device 1100 may form part of the processor 5100, or be formed as a separate chip from the processor 5100.

Figure 20:
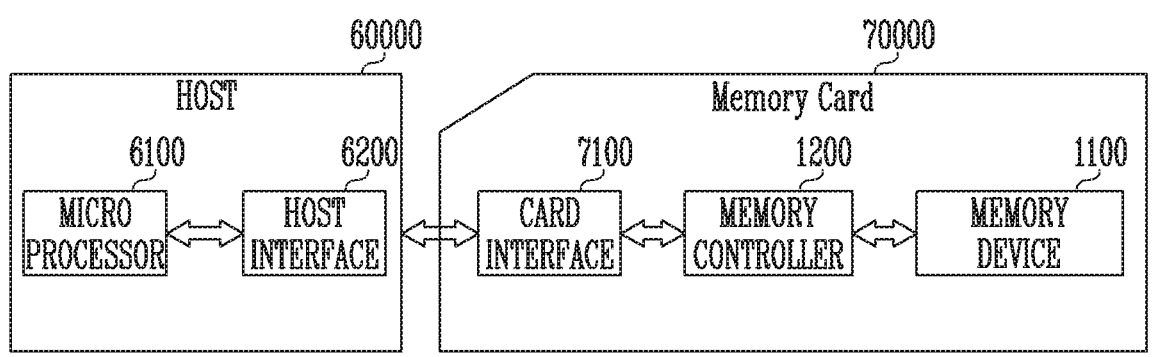

FIG. 20 is a diagram illustrating another embodiment of a memory system.

Referring to FIG. 20, a memory system 70000 may include a memory card or a smart card. The memory system 70000 may include the memory device 1100, the memory controller 1200, and a card interface 7100. The memory device 1100 may be configured and operated in the same manner as the memory device 100 shown in FIG. 1.

The memory controller 1200 may control data exchange between the memory device 1100 and the card interface 7100. According to an embodiment, the card interface 7100 may be, but is not limited to, a secure digital (SD) card interface or a multi-media card (MMC) interface.

The card interface 7100 may interface data exchange between a host 60000 and the memory controller 1200 according to a protocol of the host 60000. According to an embodiment, the card interface 7100 may support a Universal Serial Bus (USB) protocol and an InterChip (IC)-USB protocol. The card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 in response to control of a microprocessor 6100.

According to the present disclosure, a hot hole remaining in a channel of a selected string and an unselected string may be effectively removed and a read disturb phenomenon may be improved during a read operation of a memory device, such that the electrical characteristics of the memory device may be improved.

It will be apparent to those skilled in the art that various modifications can be made to the above-described embodiments of the present disclosure without departing from the spirit or scope of the present disclosure. Thus, it is intended that the present disclosure cover all such modifications provided the modifications come within the scope of the appended claims and their equivalents.

As described above, although the present disclosure is described with the limited embodiments and drawings, the present disclosure is not limited to the above-stated embodiments. It would be possible for those skilled in the art to which the present disclosure pertains to make many variations and modifications and still be consistent with the present disclosure described above.

In the above-described embodiments, all steps may be selectively performed or skipped. In addition, the steps in each embodiment may not always be performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will understand that various modifications are possible based on the technical scope of the present disclosure.

Embodiments of the present disclosure have been described with reference to the accompanying drawings and specific terms or words used in the description should be construed in accordance with the spirit of the present disclosure without limiting the subject matter thereof. It should be understood that many variations and modifications of the teachings described herein will still fall within the spirit and scope of the present disclosure as defined in the accompanying claims and equivalents thereof.

What is claimed is:

1. A memory device, comprising:
a memory cell array including a plurality of strings;
a voltage generating circuit configured to apply a turn-on voltage to the plurality of strings for a predetermined time period during a channel initialization operation of a read operation of a selected string among the plurality of strings; and
a control logic configured to set the predetermined time period of applying the turn-on voltage to the plurality of strings and to control the voltage generating circuit to apply the turn-on voltage to the plurality of strings for the predetermined time period,
wherein the control logic sets the predetermined time period for the selected string as a first time period and the predetermined time period for unselected strings among the plurality of strings to be shorter than the first time period,
wherein the unselected strings include first unselected strings sharing a source select line with the selected string and second unselected strings except for the first unselected strings among the unselected strings, and
wherein the predetermined time period of applying the turn-on voltage to a drain select line of the first unselected strings is longer than the predetermined time period of applying the turn-on voltage to a drain select line of the second unselected strings.

2. The memory device of claim 1, wherein at least two strings of the plurality of strings share one source select line and the at least two strings are coupled to different drain select lines.

3. The memory device of claim 2,
wherein each of the plurality of strings includes a drain select transistor, a plurality of memory cells, and a source select transistor coupled in series between a bit line and a source line, and
wherein the voltage generating circuit generates the turn-on voltage and applies the turn-on voltage to the drain select line coupled to the drain select transistor and the source select line coupled to the source select transistor for the predetermined time period.

4. The memory device of claim 3,
wherein the control logic sets the predetermined time period of applying the turn-on voltage to the drain select transistor of the first unselected strings as a second time period shorter than the first time period, and
wherein the control logic sets the predetermined time period of applying the turn-on voltage to the drain select transistor and the source select transistor of the second unselected strings as a third time period shorter than the second time period.

5. The memory device of claim 3,
wherein the control logic sets the predetermined time period of applying the turn-on voltage to the drain select transistor of the unselected strings as a second time period shorter than the first time period, and
wherein the predetermined time period of applying the turn-on voltage to the source select transistor of the unselected strings is set as a third time period shorter than the second time period.

6. The memory device of claim 1, wherein the control logic is further configured to control the voltage generating circuit to perform a read voltage applying operation for applying a read voltage and a pass voltage to word lines of the selected string after the channel initialization operation.

7. A memory device, comprising:
a memory cell array including a plurality of strings;
a voltage generating circuit configured to apply a turn-on voltage to the plurality of strings for a predetermined time period during a channel initialization operation of a read operation of a selected string among the plurality of strings; and
control logic configured to set the predetermined time period of applying the turn-on voltage to the plurality of strings and to control the voltage generating circuit to apply the turn-on voltage to the plurality of strings for the predetermined time period,
wherein the control logic sets the predetermined time period for a first unselected string sharing a source select line with the selected string among the plurality of strings as a first time period and sets the predetermined time period for a second unselected string among the plurality of strings as a second time period shorter than the first time period, and
wherein the predetermined time period of applying the turn-on voltage to a drain select transistor of the first unselected string is longer than the predetermined time period of applying the turn-on voltage to a drain select transistor of the second unselected string.

8. The memory device of claim 7,
wherein the first time period is a time period of applying the turn-on voltage to the drain select transistor of the first unselected string, and
wherein the second time period is a time period of applying the turn-on voltage to the drain select transistor of the second unselected string.

9. The memory device of claim 8, wherein the control logic sets the predetermined time period of applying the turn-on voltage to a source select transistor of the second unselected string as the second time period or as a third time period shorter than the second time period.

10. The memory device of claim 7, wherein the control logic sets the predetermined time period for the selected string as a fourth time period longer than the first time period.

11. The memory device of claim 7, wherein the control logic is further configured to control the voltage generating circuit to perform a read voltage applying operation for applying a read voltage and a pass voltage to word lines of the selected string after the channel initialization operation.

12. A memory device, comprising:
a memory cell array including a plurality of strings;
a voltage generating circuit configured to apply a turn-on voltage to the plurality of strings for a predetermined time period during a channel initialization operation of a read operation of a selected string among the plurality of strings; and
control logic configured to set the predetermined time period of applying the turn-on voltage to the plurality of strings and to control the voltage generating circuit to apply the turn-on voltage to the plurality of strings for the predetermined time period,
wherein the control logic sets the predetermined time period such that the turn-on voltage is applied to a source select transistor of unselected strings among the plurality of strings for a first time period and the turn-on voltage is applied to a drain select transistor of the unselected strings for a time period longer than the first time period, and
wherein the predetermined time period of applying the turn-on voltage to a drain select transistor of first unselected strings sharing a source select line with the selected string among the unselected strings is set to be longer than the predetermined time period of applying the turn-on voltage to a drain select transistor of second unselected strings except for the first unselected strings among the unselected strings.

13. The memory device of claim 12, wherein at least two strings of the plurality of strings share one source select line and the at least two strings are coupled to different drain select lines.

14. The memory device of claim 13,
wherein the control logic sets the predetermined time period of applying the turn-on voltage to the drain select transistor of the first unselected strings as a second time period longer than the first time period, and
wherein the control logic sets the predetermined time period of applying the turn-on voltage to the drain select transistor of the second unselected strings as a third time period longer than the first time period and shorter than the second time period.

15. The memory device of claim 12, wherein the control logic sets the predetermined time period for the selected string to be longer than the predetermined time period for the unselected strings.

16. A method of operating a memory device, the method comprising:
providing a memory cell array including a plurality of strings;
setting a time period, for which a turn-on voltage is applied to the plurality of strings during a channel initialization operation such that the time period for a selected string and the time period for unselected strings are different from each other; and
applying the turn-on voltage to the selected string and the unselected strings during the channel initialization operation,
wherein the setting of the time period for which the turn-on voltage is applied comprises setting the time period of applying the turn-on voltage to a drain select transistor of first unselected strings sharing a source select line with the selected string among the unselected strings longer than the time period of applying the turn-on voltage to a drain select transistor of second unselected strings except for the first unselected strings among the unselected strings.

17. The method of claim 16, wherein the time period for the selected string is a first time period and the time period for the unselected strings is shorter than the first time period.

18. The method of claim 17, wherein at least two strings of the plurality of strings share one source select line and the at least two strings are coupled to different drain select lines.

19. The method of claim 18,
wherein the turn-on voltage is applied to a drain select line of the first unselected strings for a second time period shorter than the first time period during the channel initialization operation, and
wherein the turn-on voltage is applied to a drain select line and a source select line of the second unselected strings for a third time period shorter than the second time period during the channel initialization operation.

20. The method of claim 17, further comprising performing a read voltage applying operation for applying a read voltage and a pass voltage to word lines of the selected string after the channel initialization operation.

21. A memory device, comprising:
a memory cell array including a plurality of strings;
a voltage generating circuit configured to apply a turn-on voltage to the plurality of strings for a predetermined time period during a channel initialization operation of a read operation of a selected string among the plurality of strings; and control logic configured to set the predetermined time period of applying the turn-on voltage to the plurality of strings and to control the voltage generating circuit to apply the turn-on voltage to the plurality of strings for the predetermined time period, wherein the control logic sets the predetermined time period for the selected string as a first time period, wherein the control logic sets the predetermined time period for a first unselected string sharing a source select line with the selected string among the plurality of strings as a second time period shorter than the first time period, and wherein the control logic sets the predetermined time period for a second unselected string among the plurality of strings as a third time period shorter than the second time period.

22. A method of operating a memory device, the method comprising:

providing a memory cell array including a plurality of strings;

setting a time period, for which a turn-on voltage is applied to the plurality of strings during a channel initialization operation such that the time period for a selected string and the time period for unselected strings are different from each other; and applying the turn-on voltage to the selected string and the unselected strings during the channel initialization operation, wherein the setting of the time period for which the turn-on voltage is applied comprises:

setting the time period for the selected string as a first time period;

setting the time period for a first unselected string sharing a source select line with the selected string among the unselected strings as a second time period shorter than the first time period; and setting the time period for a second unselected string except for the first unselected string among the unselected strings as a third time period shorter than the second time period.

* * * * *